(12) United States Patent
Nishimura

(10) Patent No.: US 11,108,373 B2
(45) Date of Patent: Aug. 31, 2021

(54) RESONATOR AND RESONANCE DEVICE

(71) Applicant: Murata Manufacturing Co., Ltd., Nagaokakyo (JP)

(72) Inventor: Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 549 days.

(21) Appl. No.: 16/174,526

(22) Filed: Oct. 30, 2018

(65) Prior Publication Data
US 2019/0074811 A1 Mar. 7, 2019

Related U.S. Application Data

(63) Continuation of application No. PCT/JP2017/000968, filed on Jan. 13, 2017.

(30) Foreign Application Priority Data

May 26, 2016 (JP) .............................. JP2016-105531

(51) Int. Cl.
*H03H 9/19* (2006.01)
*H03H 9/10* (2006.01)
(Continued)

(52) U.S. Cl.
CPC ........... *H03H 9/02102* (2013.01); *B81B 3/00* (2013.01); *H03H 9/02* (2013.01); *H03H 9/0595* (2013.01);
(Continued)

(58) Field of Classification Search
CPC .. H03H 9/02; H03H 9/05; H03H 9/10; H03H 9/02102; H03H 9/1014; H03H 9/13;
(Continued)

(56) References Cited

U.S. PATENT DOCUMENTS

2014/0077898 A1 3/2014 Pensala et al.
2016/0064642 A1 3/2016 Nishimura
(Continued)

FOREIGN PATENT DOCUMENTS

JP S55140313 A 11/1980
JP 2009111623 A 5/2009
(Continued)

OTHER PUBLICATIONS

International Search Report issued for PCT/JP2017/000968, dated Mar. 21, 2017.
(Continued)

*Primary Examiner* — J. San Martin
(74) *Attorney, Agent, or Firm* — Arent Fox LLP

(57) ABSTRACT

A vibrator that includes a silicon substrate, an electrode facing a surface of the silicon substrate, and a piezoelectric body between the silicon substrate and the electrode and that produces contour vibration in a plane along the surface of the silicon substrate in accordance with a voltage applied to the electrode. The vibrator includes one or more substantially rectangular vibration regions each having a long side parallel to a node of the contour vibration of the piezoelectric body and a short side orthogonal to the node of the contour vibration of the piezoelectric body and corresponding to a half-wavelength of the contour vibration. The resonator satisfies $W/T \geq 4$ and $y = -0.85 \times (1/T) + 0.57 \pm 0.05$ where T is the thickness of the silicon substrate, W is the width of the short side of the vibration region, and y is the resistivity of the silicon substrate.

20 Claims, 20 Drawing Sheets

(51) Int. Cl.
  H03H 9/17    (2006.01)
  H03H 9/02    (2006.01)
  B81B 3/00    (2006.01)
  H03H 9/24    (2006.01)
  H03H 9/05    (2006.01)
  H03H 9/13    (2006.01)
  H03H 9/15    (2006.01)

(52) U.S. Cl.
  CPC .......... *H03H 9/1014* (2013.01); *H03H 9/13* (2013.01); *H03H 9/176* (2013.01); *H03H 9/19* (2013.01); *H03H 9/24* (2013.01); *H03H 2009/155* (2013.01)

(58) Field of Classification Search
  CPC .......... H03H 9/19; H03H 9/24; H03H 9/0595; H03H 9/176; H03H 2009/155; B81B 3/00
  See application file for complete search history.

(56) References Cited

U.S. PATENT DOCUMENTS

| | | | |
|---|---|---|---|
| 2016/0322954 A1* | 11/2016 | Kaida | B81B 3/0086 |
| 2017/0069822 A1 | 3/2017 | Nishimura | |
| 2017/0179922 A1 | 6/2017 | Nakamura et al. | |
| 2017/0201226 A1* | 7/2017 | Kawai | H03H 9/10 |
| 2017/0294894 A1* | 10/2017 | Aida | C23C 14/0617 |

FOREIGN PATENT DOCUMENTS

| | | |
|---|---|---|
| JP | 2014507096 A | 3/2014 |
| WO | 2015108124 A1 | 7/2015 |
| WO | 2016006433 A1 | 1/2016 |
| WO | 2016063863 A1 | 4/2016 |

OTHER PUBLICATIONS

Written Opinion of the International Searching Authority issued for PCT/JP2017/000968, dated Mar. 21, 2017.

* cited by examiner

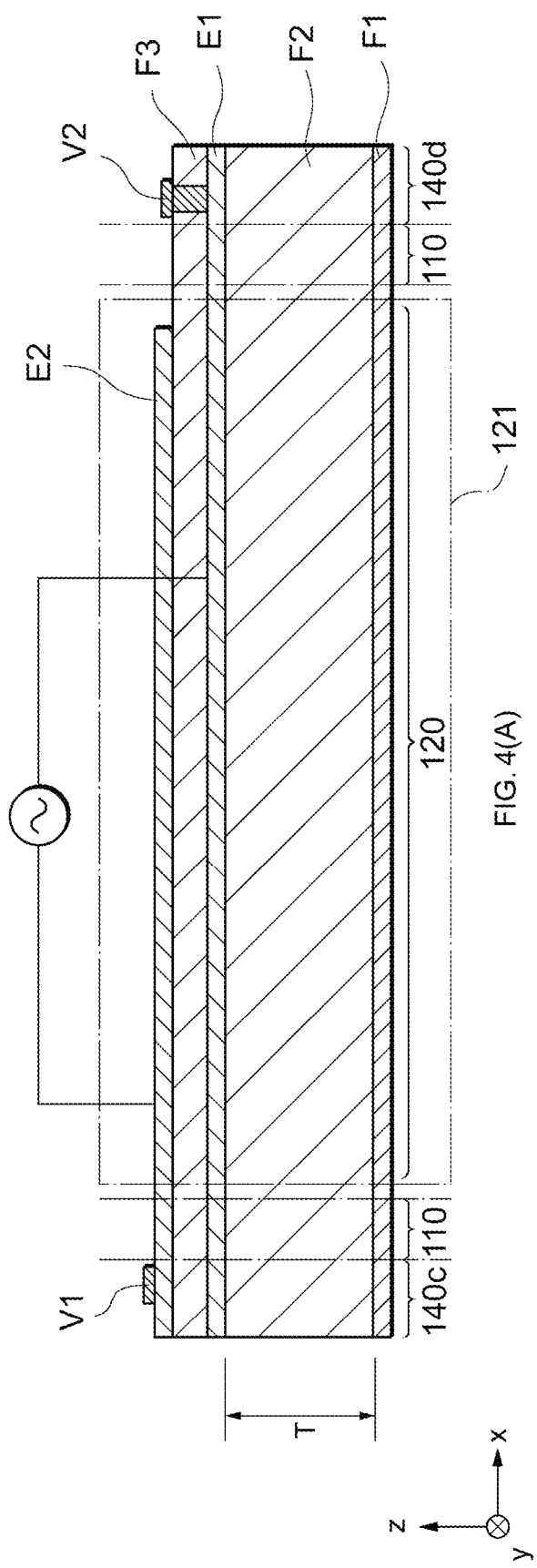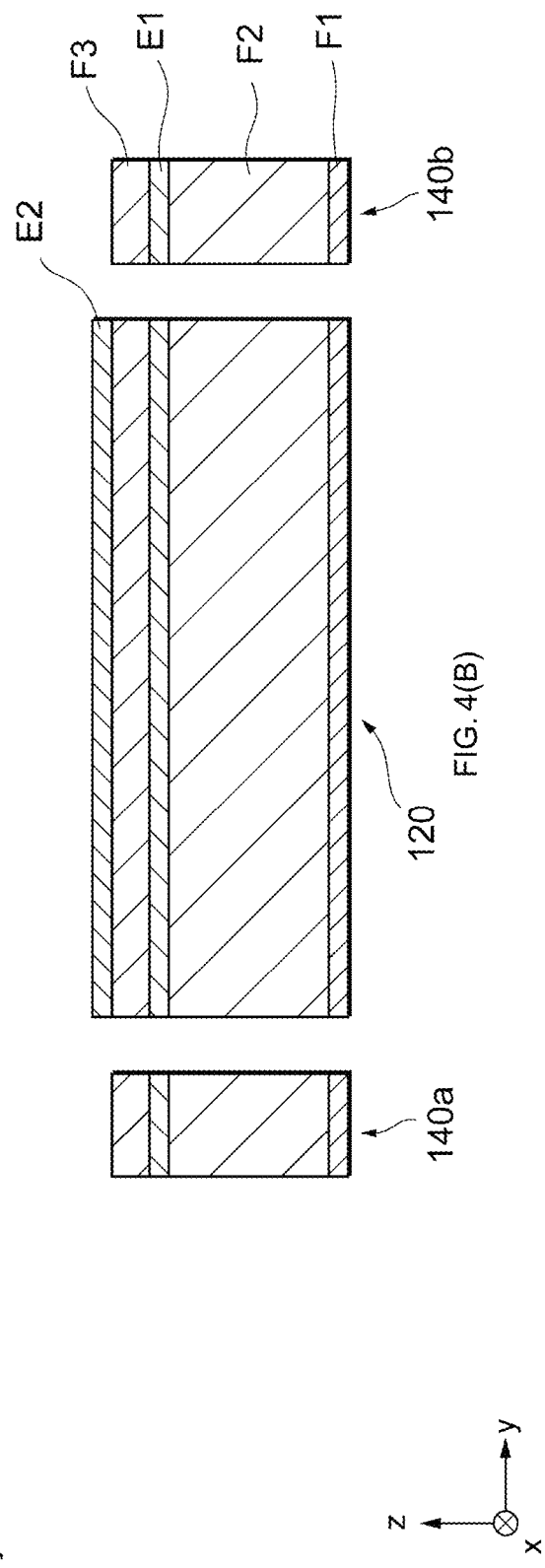
FIG. 4(A)
FIG. 4(B)

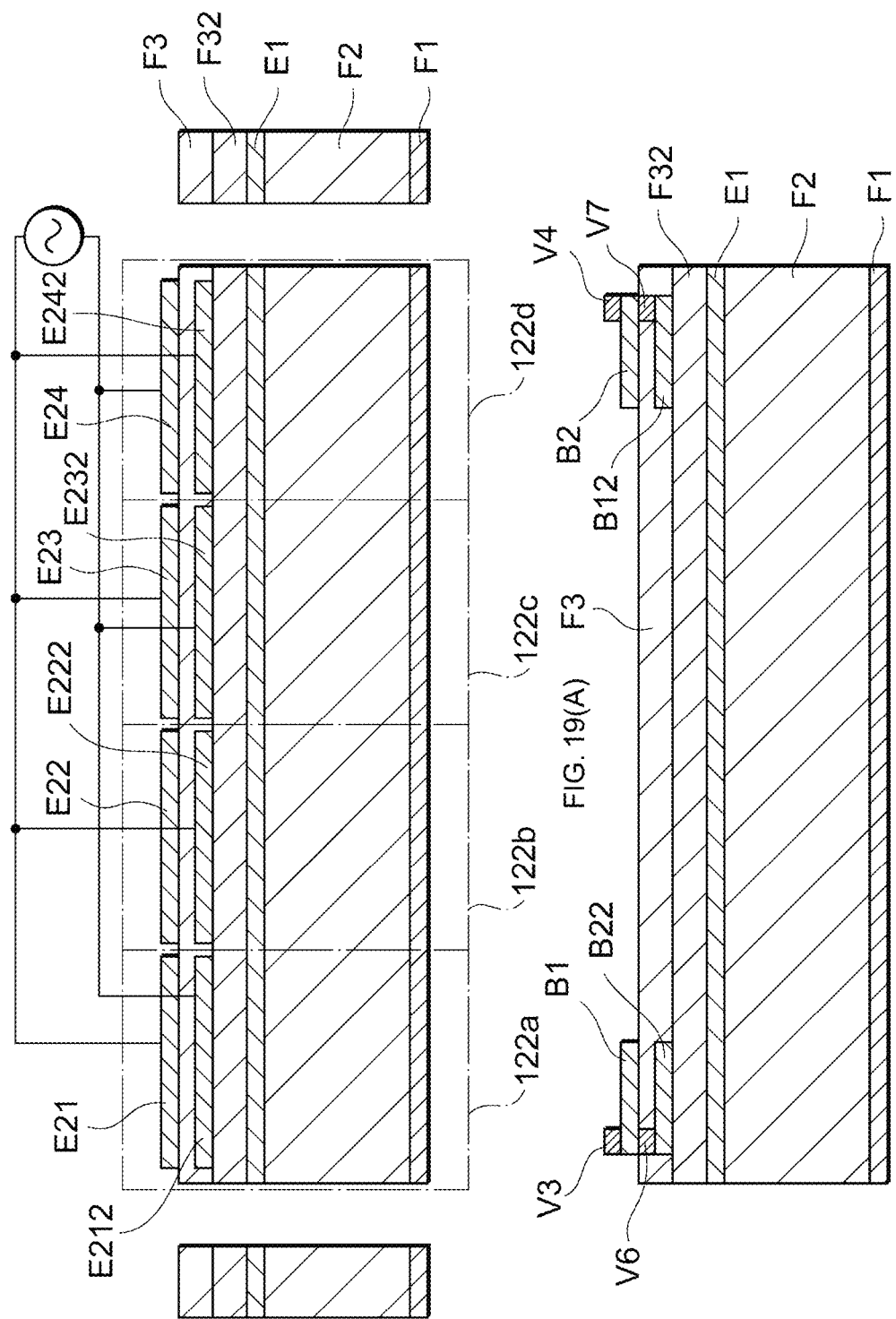
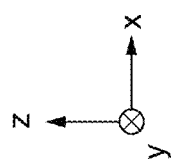
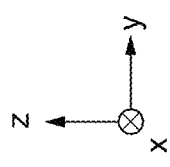
FIG. 19(A)
FIG. 19(B)

RESONATOR AND RESONANCE DEVICE

CROSS REFERENCE TO RELATED APPLICATIONS

The present application is a continuation of PCT/JP2017/000968 filed Jan. 13, 2017, which claims priority to Japanese Patent Application No. 2016-105531, filed May 26, 2016, the entire contents of each of which are incorporated herein by reference.

TECHNICAL FIELD

The present disclosure relates to a resonator and a resonance device including a vibrator that vibrates in an in-plane vibration mode.

BACKGROUND

Resonators using MEMS (microelectromechanical system) are typically used as a timing device, for example. In such designs, the resonator is mounted on a printed circuit board to be incorporated into an electronic device such as a smartphone. MEMS resonators have been subjected to various trials for improving the temperature coefficient of resonant frequency (TCF: Temperature Coefficients of Frequency) thereof.

For example, Patent Document 1 (identified below) discloses a resonator including a vibration or deflection element made of a semiconductor material that contains an n-type doping agent and an excitation or detection unit that is functionally connected to the vibration or deflection element. In the resonator described in Patent Document 1, a spring thereof is set in a direction of a spring constant depending mainly on items C11-C12, thereby enabling a variation in the spring constant due to temperature to be reduced by n-type doping.

Patent Document 1: Japanese Unexamined Patent Application Publication (Translation of PCT Application) No. 2014-507096.

In the resonator in Patent Document 1, only a linear temperature coefficient of resonant frequency (i.e., linear TCF) is controlled, and a quadratic or higher TCF, which is not mentioned in Patent Document 1, needs to be improved.

SUMMARY OF THE INVENTION

The present invention is made in consideration of such a circumstance and addresses reducing the quadratic or higher TCF in a resonator.

Specifically, a resonator is disclosed according to an exemplary aspect that includes a vibrator with a silicon substrate, at least one electrode that has a face facing a surface of the silicon substrate, and a piezoelectric body that is formed between the silicon substrate and the electrode and that produces contour vibration in a plane along the surface of the silicon substrate in accordance with a voltage applied to the electrode. Moreover, the resonator includes a holder or frame that surrounds at least a portion of the vibrator; and a holding arm that connects the vibrator and the holder/frame to each other. In the exemplary aspect, the vibrator includes at least one substantially rectangular vibration region that has a long side parallel to a node of the contour vibration of the piezoelectric body and a short side orthogonal to the node of the contour vibration of the piezoelectric body and corresponding to a half-wavelength of the contour vibration. Moreover, the resonator is set within a range that satisfies $W/T \geq 4$ and $y=-0.85 \times (1/T)+0.57 \pm 0.05$ where T is a thickness of the silicon substrate in a direction orthogonal to the surface thereof, W is a width of the short side of the vibration region, and y is a resistivity of the silicon substrate.

According to the present disclosure, a resonator is provided that reduces a quadratic or higher TCF.

BRIEF DESCRIPTION OF DRAWINGS

FIGS. 4(A) and 4(B) are sectional views taken along line A-A' and line B-B' in FIG. 3.

FIGS. 19(A) and 19(B) are sectional views taken along line C-C' and line D-D' in FIG. 14.

DETAILED DESCRIPTION OF EXEMPLARY EMBODIMENTS

First Embodiment

Figure 1:
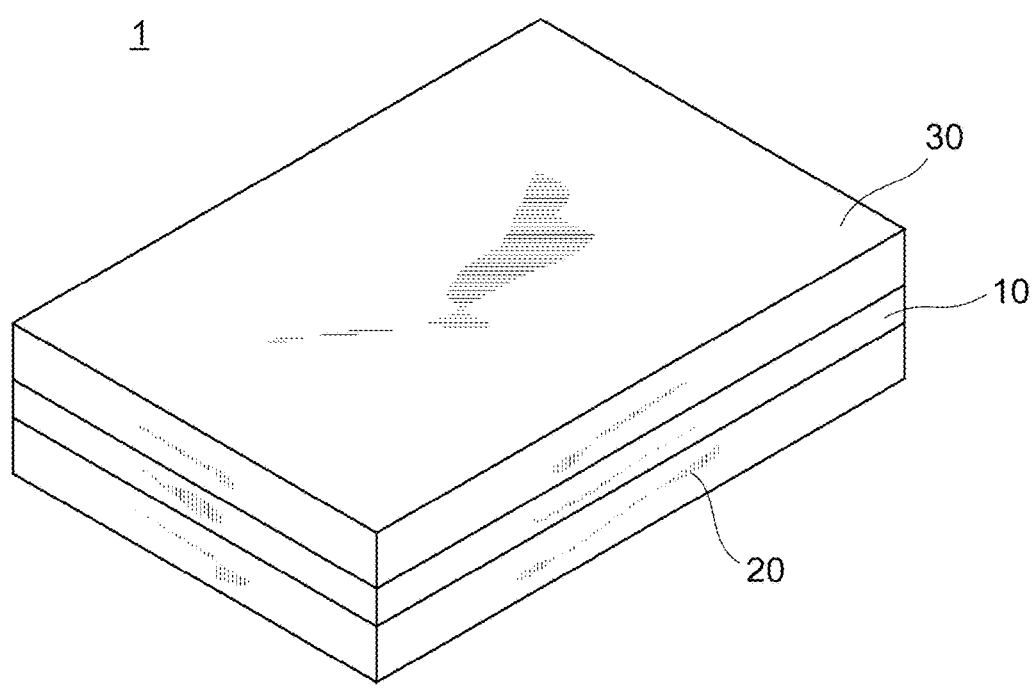
FIG. 1 is a perspective view schematically showing an appearance of a resonance device according to a first exemplary embodiment.
Figure 2:
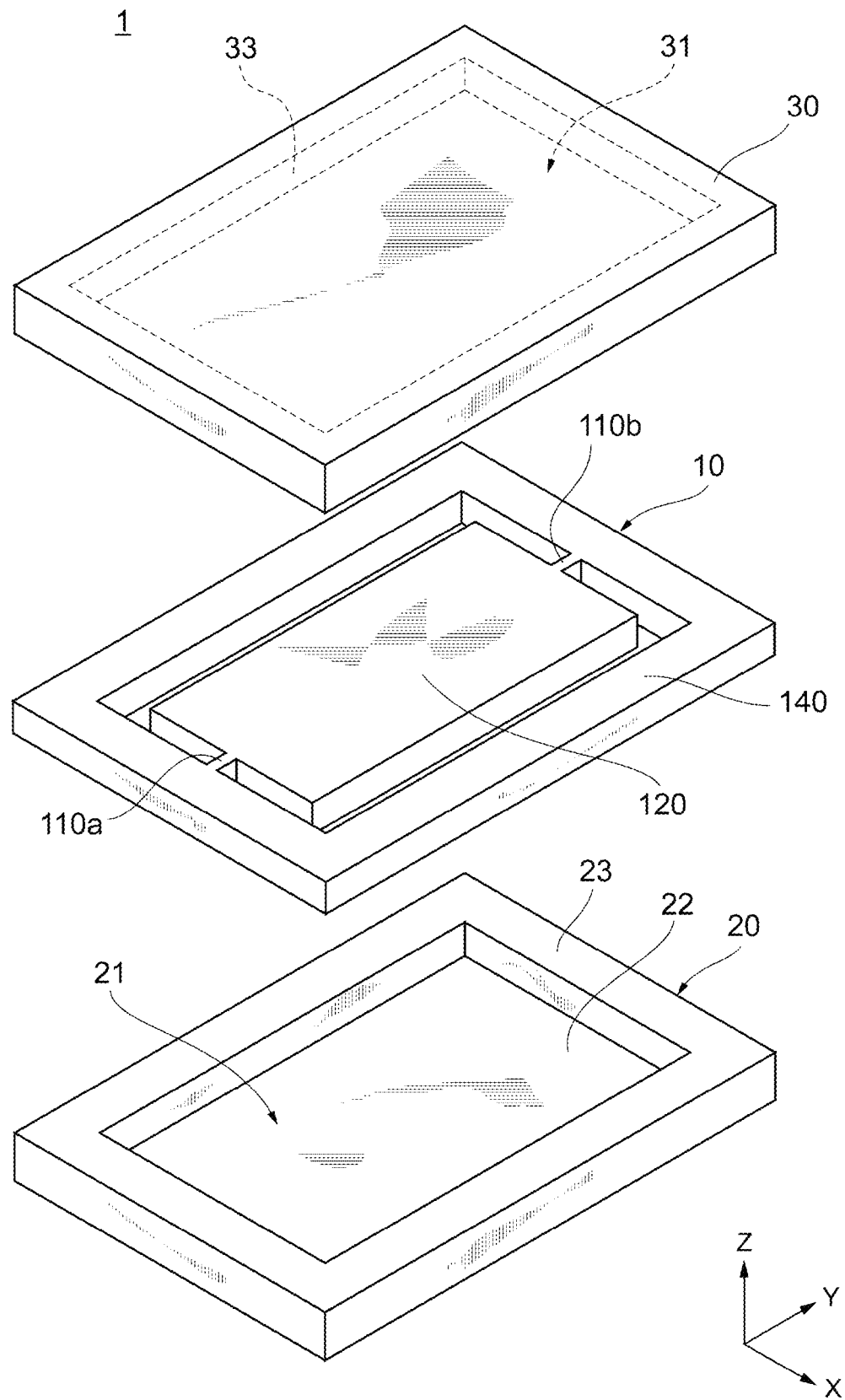
FIG. 2 is an exploded perspective view schematically showing a structure of the resonance device according to the first exemplary embodiment.

Hereinafter, a first exemplary embodiment will be described with reference to the attached drawings. FIG. 1 is a perspective view schematically showing an appearance of a resonance device 1 according to the first exemplary embodiment. FIG. 2 is an exploded perspective view schematically showing a structure of the resonance device 1 according to the first exemplary embodiment.

The resonance device 1 includes a resonator 10 and an upper cover 30 and a lower cover 20 provided with the resonator 10 therebetween. In other words, the resonance device 1 is formed by the lower cover 20, the resonator 10, and the upper cover 30 that are laminated in this order.

In addition, the resonator 10, the lower cover 20, and the upper cover 30 are joined together, thereby sealing the resonator 10 and forming a vibration space of the resonator 10. The resonator 10, the lower cover 20, and the upper cover 30 are each formed of a Si substrate. The Si substrates thereof are joined together, and the resonator 10, the lower cover 20, and the upper cover 30 are thereby joined together. Each of the resonator 10 and the lower cover 20 may be formed of a SOI substrate.

According to the exemplary aspect, the resonator 10 is a MEMS resonator manufactured by using MEMS technology. In the present embodiment, the resonator 10 that is formed of a silicon substrate (Si substrate) as an example; however, the silicon substrate is not limited to a silicon substrate formed of only a silicon material and, as described later, includes a silicon substrate doped with an N-type semiconductor material such as P (phosphorus) (for example, a silicon substrate formed of a degenerate semiconductor).

Hereinafter, configurations of the resonance device 1 will be described in detail.

Upper Cover 30

The upper cover 30 extends in a flat plate shape in an XY plane and has, on a rear surface thereof, a recessed portion 31 that has, for example, a flat rectangular parallelepiped shape. The recessed portion 31 is surrounded by a side wall 33 and forms a portion of a vibration space, which is a space in which the resonator 10 vibrates.

Lower Cover 20

The lower cover 20 includes a rectangular flat plate-shaped bottom plate 22 that extends in the XY plane and a side wall 23 that extends from a peripheral edge portion of the bottom plate 22 in the Z-axis direction (that is, the lamination direction of the lower cover 20 and the resonator 10). The lower cover 20 has, on a face thereof facing the resonator 10, a recessed portion 21 that is formed by a surface of the bottom plate 22 and an inner surface of the side wall 23. The recessed portion 21 forms a portion of the vibration space of the resonator 10. The vibration space is hermetically sealed by the upper cover 30 and the lower cover 20 described above and is maintained in a vacuum state. The vibration space may be filled with, for example, a gas such as an inert gas.

Resonator 10

Figure 3:
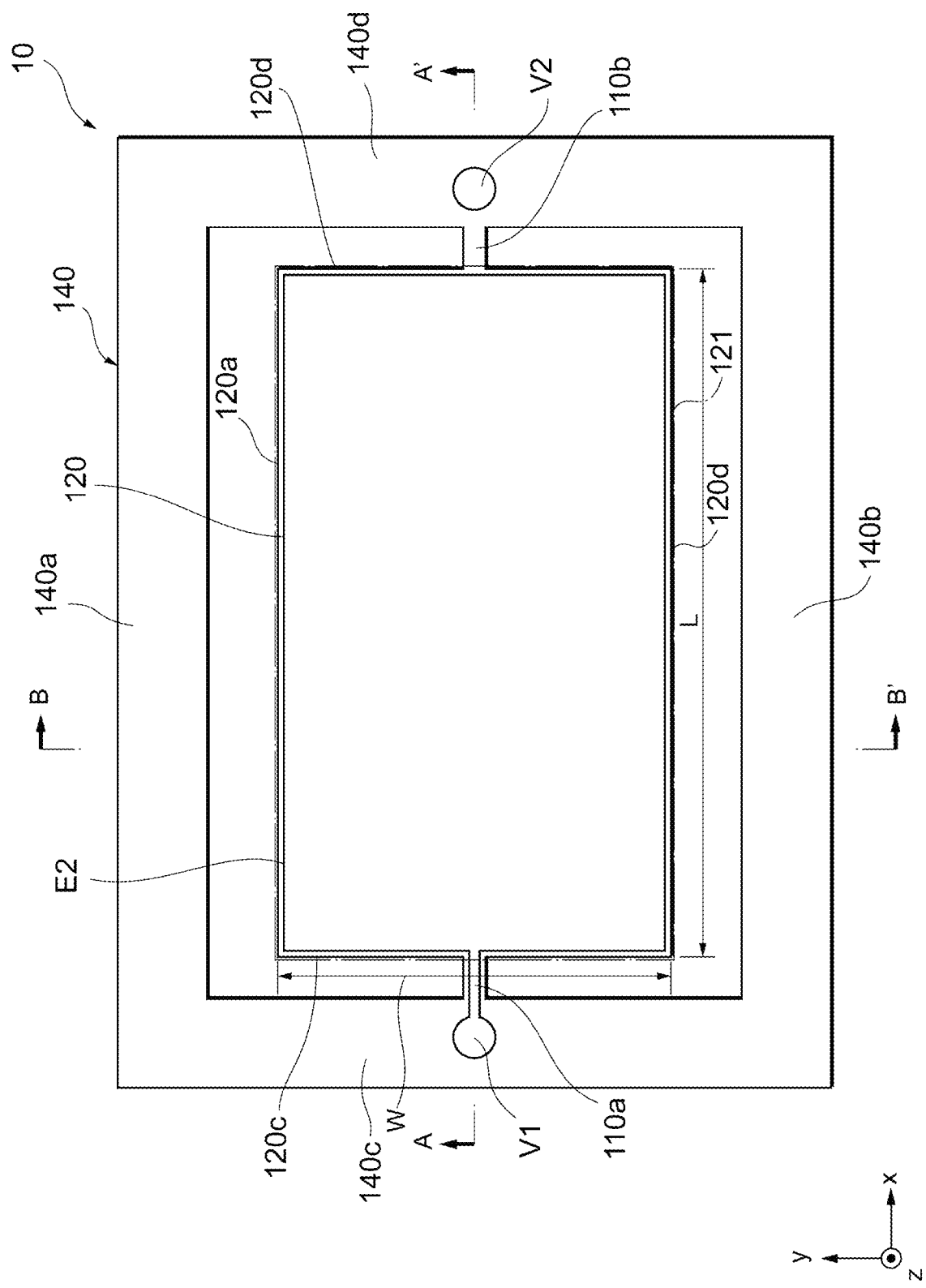
FIG. 3 is a plan view of a resonator according to the first exemplary embodiment from which an upper substrate is removed.

FIG. 3 is a plan view schematically showing a structure of the resonator 10 according to the present exemplary embodiment. With reference to FIG. 3, configurations of the resonator 10 according to the present embodiment will be described. The resonator 10 includes a vibrator 120, a holder 140 (i.e. a frame or resonator frame), and holding arms 110a and 110b (hereinafter, also referred to as the "holding arms 110").

Vibrator 120

The vibrator 120 has a rectangular contour extending in the XY plane in the orthogonal coordinate system in FIG. 3. The vibrator 120 is provided inside the holder 140 with a space of a predetermined distance formed between the vibrator 120 and the holder 140.

The vibrator 120 includes, on a surface thereof, a rectangular plate-shaped upper electrode (an example of an electrode) E2 that has a lengthwise direction and a widthwise direction. In FIG. 3, the vibrator 120 has long sides in the X-axis direction and short sides in the Y-axis direction, and the upper electrode E2 similarly has long sides in the X-axis direction and short sides in the Y-axis direction.

While details will be described with reference to FIG. 4, the vibrator 120 has a vibration region 121 corresponding to the upper electrode E2. In the present embodiment, the vibrator 120 includes one upper electrode E2 that has a face facing the surface of a Si substrate F2 (refer to FIG. 4) and has one vibration region 121 corresponding to the one upper electrode E2. The vibration region 121 is formed such that the vibrator 120 produces contour vibration in the Y-axis direction with a node in an area that connects portions connected to the holding arms 110, which will be described later, to each other. Moreover, the vibration region 121 has long sides parallel to the node of the contour vibration of the vibrator 120 and short sides orthogonal to the node of the contour vibration and corresponding to a half-wavelength of the contour vibration. In the present embodiment, the vibration region 121 substantially coincides with the contour of the vibrator 120. In other words, in the present embodiment, the vibration region 121 has a length L corresponding to the length of the vibrator 120 in a direction along the node of the vibration, and the vibration region 121 has a width W corresponding to the length of the vibrator 120 in a direction orthogonal to the node of the vibration. In the present embodiment, the length L of the vibration region 121 is approximately 58 μm to 201 μm, and the width W is approximately 40 μm to 138 μm. Since the vibration region 121 coincides with the vibrator 120 in the present embodiment, the length of the long sides of the vibrator 120 is approximately 58 μm to 201 μm as with the length L, and the length of the short sides is approximately 40 μm to 138 μm as with the width W.

As described later, the vibrator 120 may include a plurality of upper electrodes E2. In this case, the vibrator 120 has a plurality of vibration regions 121 that are divided in accordance with the number of the plurality of upper electrodes E2. The width W of the vibration region 121 in this case corresponds to the length of the vibrator 120 divided by the number of the upper electrodes in the direction orthogonal to the node of the vibration.

(b) Holder 140

The holder 140 (also considered as a frame) has a rectangular frame-like shape in the XY plane. The holder 140 surrounds an outer side portion of the vibrator 120 in the XY plane in plan view. The shape of the holder 140 is not limited to the frame-like shape provided that the holder 140 is provided at at least a portion of the periphery of the vibrator 120. For example, the holder 140 may be provided at the periphery of the vibrator 120 by an extent that enables the holder 140 to hold the vibrator 120 and be joined to the upper cover 30 and the lower cover 20.

In the present embodiment, the holder 140 is formed by frame bodies 140a, 140b, 140c, and 140d (i.e., frame lengths or sides). As shown in FIG. 3, the frame bodies 140a to 140d are integrally formed to have a prism shape. As shown in FIG. 3, the frame bodies 140a and 140b face the long sides of the vibrator 120 and extend in parallel thereto in the X-axis direction. The frame bodies 140c and 140d face the short sides of the vibrator 120 and extend in parallel thereto in the Y-axis direction. The frame bodies 140c and 140d are connected, at respective both ends thereof, to both ends of the frame bodies 140a and 140b.

The holding arms 110 are connected to a substantially center portion of the respective frame bodies 140c and 140d. The frame bodies 140c and 140d include terminals V1 and V2, respectively, in the vicinity of the respective portions connected to the holding arms 110. The terminal V1 is a terminal for connecting the upper electrode E2 to an external portion. The terminal V2 is a terminal for connecting a lower electrode E1, which will be described later, to an external portion.

(c) Holding Arms 110

The holding arms 110a and 110b (hereinafter, also collectively referred to as the "holding arms 110") each have a prism shape and are provided inside the holder 140 and between the short sides of the vibrator 120 and the frame bodies 140c and 140d. The holding arms 110a and 110b connect the short sides of the vibrator 120 to the respective frame bodies 140c and 140d, respectively.

On a surface of the holding arm 110a, the upper electrode E2 extends from the vibrator 120 to the frame body 140c.

Laminate Structure

With reference to FIG. 4, a laminate structure of the resonator 10 will be described. FIG. 4(A) is a sectional view taken along line A-A' in FIG. 3. FIG. 4(B) is a sectional view taken along line B-B' in FIG. 3.

In the resonator 10 according to the present embodiment, the holder 140, the vibrator 120, and the holding arms 110 are integrally formed in the same process. As shown in FIGS. 4(A) and 4(B), in the resonator 10, first, the lower electrode E1 is laminated on the Si (silicon) substrate F2 (an example of a substrate). In addition, a piezoelectric thin film F3 (an example of a piezoelectric body) is laminated on the lower electrode E1 so as to cover the lower electrode E1, and the upper electrode E2 is laminated on the piezoelectric thin film F3.

The Si substrate F2 is formed of, for example, a degenerate n-type Si semiconductor having a thickness of approximately 10 μm and may contain, as an n-type dopant, P (phosphorus), As (arsenicum), Sb (antimony), or the like. Degenerate Si used in the Si substrate F2 has a resistance value of, for example, approximately 0.53 mΩ·cm to 0.56 mΩ·cm. The thickness T of the Si substrate F2 is, for example, approximately 20 μm to 30 μm.

In addition, a temperature characteristic correction layer F1 that contains a silicon oxide (for example, $SiO_2$) is formed on a lower surface of the Si substrate F2. Consequently, it becomes possible to improve temperature characteristics.

In the present embodiment, the temperature characteristic correction layer F1 is a layer that has a function of reducing, at least in the vicinity of a normal temperature, the temperature coefficient of resonance frequency (that is, a change rate at each temperature) of the vibrator 120 in a case in which the temperature characteristic correction layer F1 is formed on the Si substrate F2, compared with a case in which the temperature characteristic correction layer F1 is not formed on the Si substrate F2. The vibrator 120 that has the temperature characteristic correction layer F1 makes it possible to reduce a variation due to temperature, for example, in the resonance frequency of a laminated structure body constituted by the Si substrate F2, the lower electrode E1, the upper electrode E2, the piezoelectric thin film F3, and the temperature characteristic correction layer F1. In the present embodiment, the thickness of the temperature characteristic correction layer F1 is approximately 0.2 μm to 0.5 μm.

In the resonator 10, the temperature characteristic correction layer F1 desirably has a uniform thickness. The uniform thickness means that a variation in thickness of the temperature characteristic correction layer F1 is within ±20% of an average value of the thickness.

Moreover, the temperature characteristic correction layer F1 may be formed on an upper surface of the Si substrate F2 or may be formed on both the upper surface and the lower surface of the Si substrate F2. In the present embodiment, at least the vibrator 120 and the holding arms 110 are formed integral with each other by the same Si substrate F2 and the same temperature characteristic correction layer F1. The temperature characteristic correction layer F1 may not be formed on the lower surface of the Si substrate F2 at the holder 140.

The upper electrode E2 and the lower electrode E1 are formed of, for example, Mo (molybdenum) or Al (aluminum). Employing degenerate Si as the Si substrate F2 enables the Si substrate F2 to also serve as the lower electrode E1. In other words, when the Si substrate F2 has a function as a lower electrode, it is possible to omit the configuration of the lower electrode E1. In the present embodiment, the thickness of the lower electrode E1 is, for example, approximately 0.1 μm, and the thickness of the upper electrode E2 is, for example, approximately 0.2 μm.

Each of the upper electrode E2 and the lower electrode E1 is formed to have a desired shape by, for example, etching. For example, on the vibrator 120, the lower electrode E1 is formed to function as a lower electrode. In addition, on the holding arms 110 and the holder 140, the lower electrode E1 is formed to function as a wire for connecting via the terminal V2 the lower electrode to an AC power source provided outside the resonator 10.

Meanwhile, on the vibrator 120, the upper electrode E2 is formed to function as an upper electrode. In addition, on the holding arms 110 and the holder 140, the upper electrode E2 is formed to function as a wire for connecting via the terminal V1 the upper electrode to the AC power source provided outside the resonator 10.

The terminal V2 is formed to be connected to the lower electrode E1 through a via, which will be described later, formed in the piezoelectric thin film F3. The terminal V1 is formed on the upper electrode E2. The terminals V1 and V2 are each formed of, for example, Mo (molybdenum) or Al (aluminum).

In an exemplary aspect, an electrode (an example of an outer electrode) is formed on an outer surface of the upper cover 30 such that the electrode connects the AC power source as an external power source and a lower wire or an upper wire to each other. In another aspect, a via is formed inside the upper cover 30 and a wire is provided in an inner portion of the via by packing a conductive material therein such that the wire connects the AC power source and the lower wire or the upper wire to each other. In either aspect, such configurations may be employed for connection from the AC power source to the terminals V1 and V2.

According to the exemplary aspect, the piezoelectric thin film F3 is a thin film of a piezoelectric body that converts an applied voltage into vibration. The piezoelectric thin film F3 may contain, as a main component, for example, a nitride such as AlN (aluminum nitride) or an oxide. Specifically, the piezoelectric thin film F3 may be formed of ScAlN (scandium aluminum nitride). ScAlN is an aluminum nitride in which a portion of aluminum is replaced with scandium. The piezoelectric thin film F3 has a thickness of, for example, approximately 0.8 μm.

Next, a function of the vibrator 120 will be described. As shown in FIG. 4(A), the vibrator 120 has the vibration region 121. In the vibration region 121, the piezoelectric thin film F3 stretches and contracts in an in-plane direction of the XY plane, that is, in the Y-axis direction in accordance with an electric field applied to the piezoelectric thin film F3 by the upper electrode E2 and the lower electrode E1. According to the exemplary aspect, the piezoelectric thin film F3 is oriented in a z-axis direction. Consequently, when a predetermined potential difference is formed between the upper electrode E2 and the lower electrode E1 by applying a predetermined electric field to the upper electrode E2 and the lower electrode E1, the piezoelectric thin film F3 stretches and contracts in the in-plane direction of the XY plane in accordance with the potential difference, and the vibration region 121 thereby produces contour vibration.

Test Results

Next, with reference to FIG. 5 to FIG. 8, results of actual measurement or simulations regarding the influence applied to the frequency-temperature characteristics of the resonator 10 when a ratio of the width W of the vibration region 121 to the thickness T of the Si substrate F2 (hereinafter also referred to as the "dimension ratio W/T of the vibrator 120") and the value of the resistivity of the Si substrate are varied in the aforementioned resonator 10.

Figure 5:
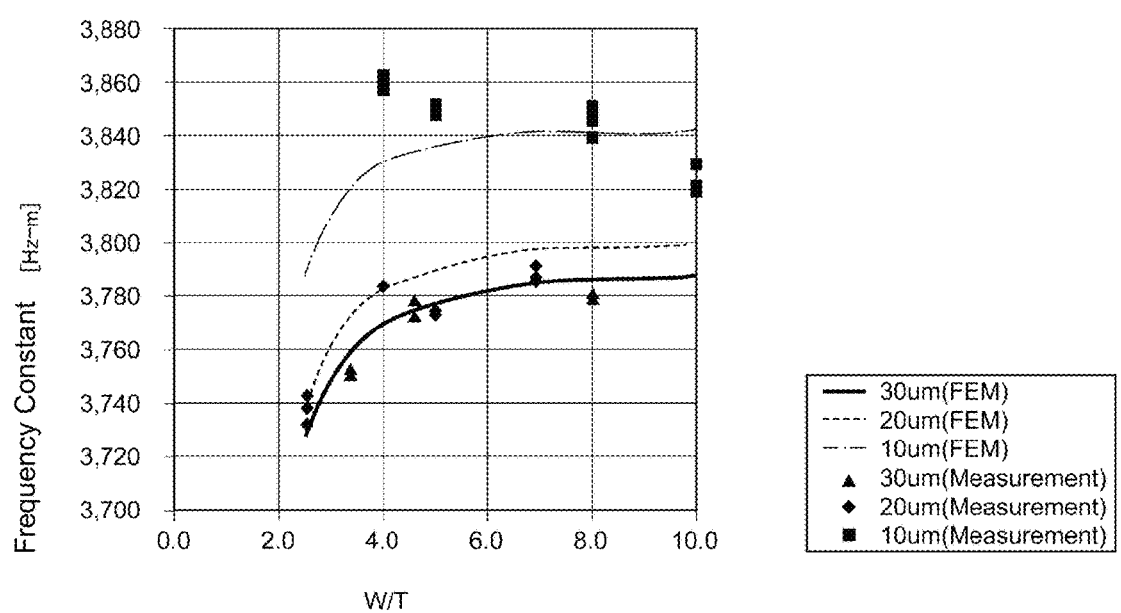
FIG. 5 is a graph showing results of tests using the resonator according to the first exemplary embodiment.

FIG. 5 shows results of actual measurement and simulations using FEM (finite element method) regarding the influence of the dimension ratio W/T of the vibrator 120 applied to the frequency constant. In the tests for which FIG. 5 shows the results, the frequency constant was measured, for each case in which the thickness T of the Si substrate F2 was set to the following three values, with the width W of the vibration region 121 varied in the resonator 10 presented in the first embodiment.

30 μm (results of the simulation are indicated by a graph of a solid line, and results of the actual measurement are indicated by triangular plots)

20 μm (results of the simulation are indicated by a graph of a dotted line, and results of the actual measurement are indicated by circular plots)

10 μm (results of the simulation are indicated by a graph of a long dashed dotted line, and results of the actual measurement are indicated by square plots)

As shown, in the graph shown in FIG. 5, the horizontal axis indicates the value of the dimension ratio W/T of the vibrator 120, and the vertical axis indicates the frequency constant. The frequency constant is a product of a resonance frequency and an element width W. The resonance frequency was measured by using an impedance analyzer.

The graph in FIG. 5 illustrates that the frequency constant is constant when the dimension ratio W/T of the vibrator 120 is 4 or more regardless of the thickness T. Meanwhile, the frequency constant gradually decreases in a region in which the dimension ratio W/T of the vibrator 120 is less than 4. According to the graph in FIG. 5, when the width W of the vibration region 121 is sufficiently larger than the thickness of the Si substrate F2, specifically, when the dimension ratio W/T of the vibrator 120 is 4 or more, the product of the resonance frequency and the width W of the vibration region 121 is constant and, consequently, it is possible to obtain stable vibration.

Figure 6:
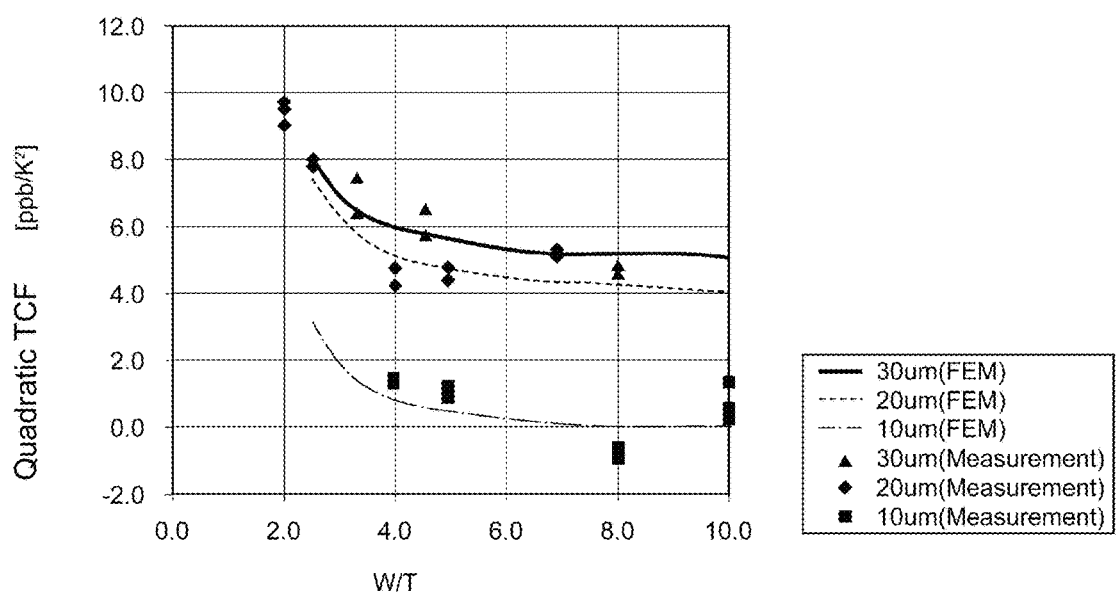
FIG. 6 is a graph showing results of tests using the resonator according to the first exemplary embodiment.

FIG. 6 shows results of actual measurement and simulations using FEM regarding the influence of the dimension ratio W/T of the vibrator 120 applied to the quadratic temperature coefficient of the resonant frequency (quadratic TCF) of the frequency-temperature characteristics. In the tests for which FIG. 6 shows the results, the quadratic TCF was measured, for each case in which the thickness T of the Si substrate F2 was set to the same values as those in FIG. 5, with the width W of the vibration region 121 varied in the resonator 10 presented in the first embodiment.

In the graph shown in FIG. 6, the horizontal axis indicates the value of the dimension ratio W/T of the vibrator 120, and the vertical axis indicates the value of the quadratic TCF. The frequency-temperature characteristics were calculated in the following procedure. First, the resonator 10 was set in a thermostatic bath, the resonance frequency at a desired temperature was measured by using a network analyzer, and the change rate of the resonance frequency at each temperature relative to the resonance frequency at 25° C. was plotted. Then, the linear TCF, the quadratic TCF, and the cubic TCF were calculated by performing a cubic approximation of the relationship of the resonance frequency with respect to temperature.

The graph in FIG. 6 shows that the value of the quadratic TCF was converged to substantially 0 in a region in which the dimension ratio W/T of the vibrator 120 is 4 or more regardless of the thickness T and that it is consequently possible to obtain favorable frequency-temperature characteristics.

Figure 7:
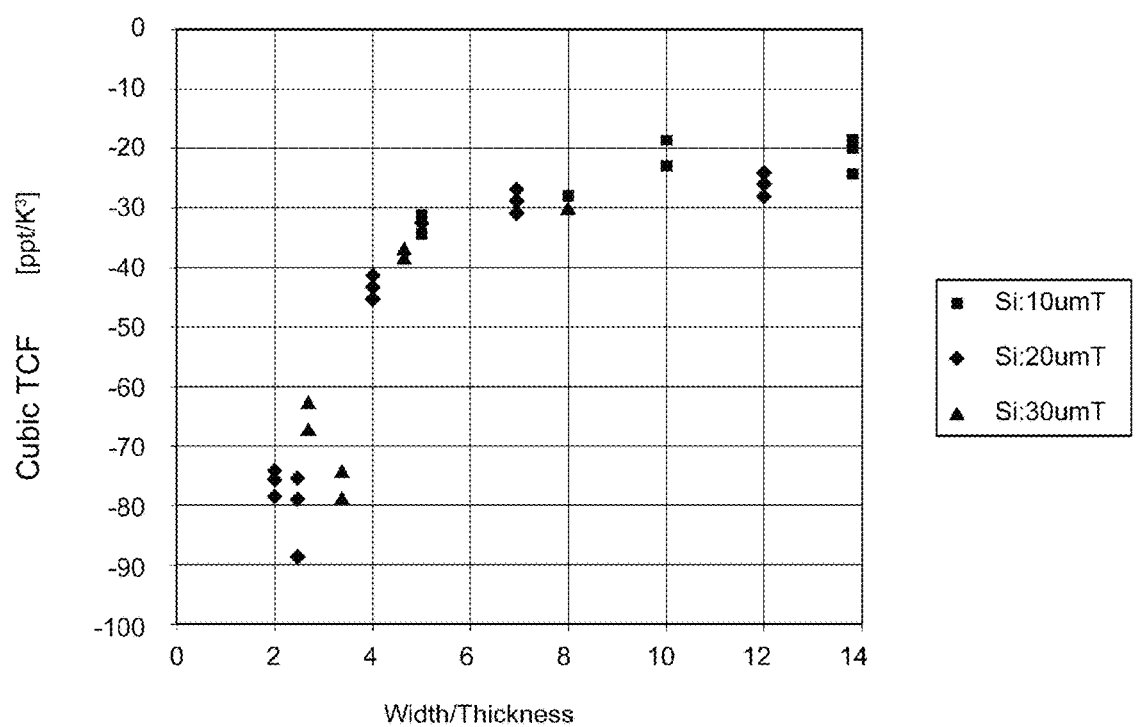
FIG. 7 is a graph showing results of tests using the resonator according to the first exemplary embodiment.

FIG. 7 shows results of actual measurement regarding the influence of the dimension ratio W/T of the vibrator 120 applied to the cubic temperature coefficient of resonant frequency (cubic TCF) of the frequency-temperature characteristics. In the tests for which FIG. 7 shows the results, the cubic TCF was measured, for each case in which the thickness T of the Si substrate F2 was set to the same values as those in FIG. 5, with the width W of the vibration region 121 varied in the resonator 10 presented in the first embodiment.

In the graph in FIG. 7, the horizontal axis indicates the value of the dimension ratio W/T of the vibrator 120, and the vertical axis indicates the value of the cubic TCF. The cubic TCF was calculated by the method described above.

FIG. 7 shows that the value of the cubic TCF gradually approximates to 0 as the value of W/T increases in a region in which the dimension ratio W/T of the vibrator 120 is 4 or more and that it is consequently possible to obtain favorable frequency-temperature characteristics.

Figure 8:
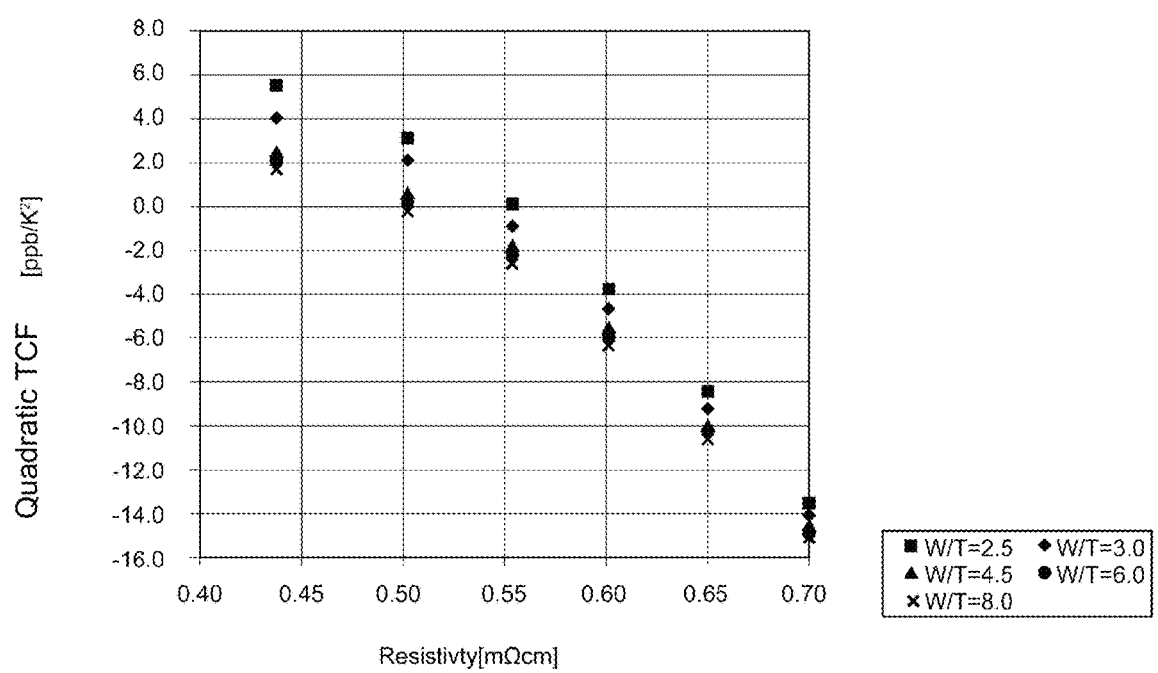
FIG. 8 is a graph showing results of tests using the resonator according to the first exemplary embodiment.

Next, FIG. 8 shows results of actual measurement regarding the influence of the resistivity of the Si substrate F2 applied to the quadratic TCF. In the tests for which FIG. 8 shows the results, the quadratic TCF was measured, for each case in which the dimension ratio W/T of the vibrator 120 was set to the following values, with the resistivity of the Si substrate F2 varied in the resonator 10 presented in the first embodiment.

W/T=2.5 (indicated by square plots)
W/T=3.0 (indicated by rhombus plots)
W/T=4.5 (indicated by triangular plots)
W/T=6.0 (indicated by circular plots)
W/T=8.0 (indicated by x-shaped plots)

In the graph shown in FIG. 8, the horizontal axis indicates the value of the resistivity of the Si substrate F2, and the vertical axis indicates the value of the quadratic TCF. The quadratic TCF was measured by the same method as that in the tests in FIG. 6.

The graph in FIG. 8 shows that as the resistivity of the Si substrate F2 increases, the value of the quadratic TCF decreases regardless of the dimension ratio W/T of the vibrator 120.

Relationship Between Resistivity and Thickness of Si Substrate

The tests for which FIGS. 5 to 8 show the results indicate that it is possible to approximate the value of the quadratic TCF to 0 by adjusting the resistivity of the Si substrate F2 and the dimension ratio W/T of the vibrator 120 and it is thereby possible to obtain the resonator 10 that has favorable frequency-temperature characteristics.

(a) Case in which W/T≥4

Figure 9:
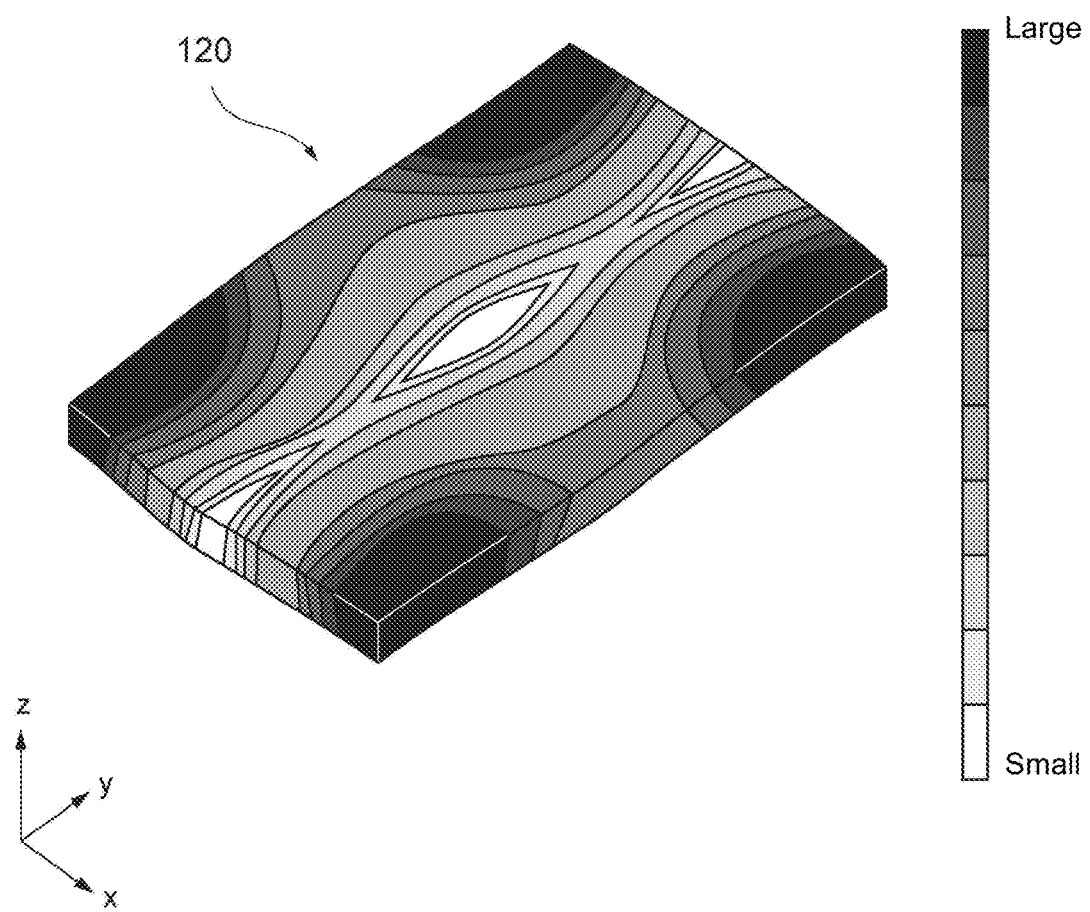
FIG. 9 is a graph showing results of analyzing a vibration mode of the resonator according to the first exemplary embodiment.

FIG. 9 shows results of analysis using FEM regarding a vibration shape when the dimension ratio W/T of the vibrator 120 was set to 4 or more (W: 100, T: 10) in the resonator 10 according to the present embodiment. FIG. 9 selectively shows the analysis results of the vibrator 120 of the resonator 10. In FIG. 9, a light-colored region indicates a region in which a displacement due to vibration is small, and a dark-colored region indicates a region in which a displacement due to vibration is large.

FIG. 9 shows that the vibration mode of the resonator 10 is a two-dimensional vibration in only the XY plane direction in a region in which the dimension ratio W/T of the vibrator 120 is 4 or more, that is, a region in which the width W of the vibration region 121 is sufficiently larger than the thickness T of the Si substrate F2 and that it is consequently possible to obtain a stable vibration shape. Thus, in the region in which the width W of the vibration region 121 is sufficiently larger than the thickness T of the Si substrate F2, the influence of the vibration shape applied to the frequency constant, the linear TCF, and the quadratic TCF is considered to be small, and the influence of the thickness T of the Si substrate F2 and the temperature characteristics of elastic modulus (TCE) of the Si substrate F2 applied thereto is considered to be large. Accordingly, it is found that, in the region in which the dimension ratio W/T of the vibrator 120 is 4 or more, it is possible to adjust the quadratic TCF to approximate to 0 by adjusting the thickness T and the resistivity of the Si substrate F2.

Figure 10:
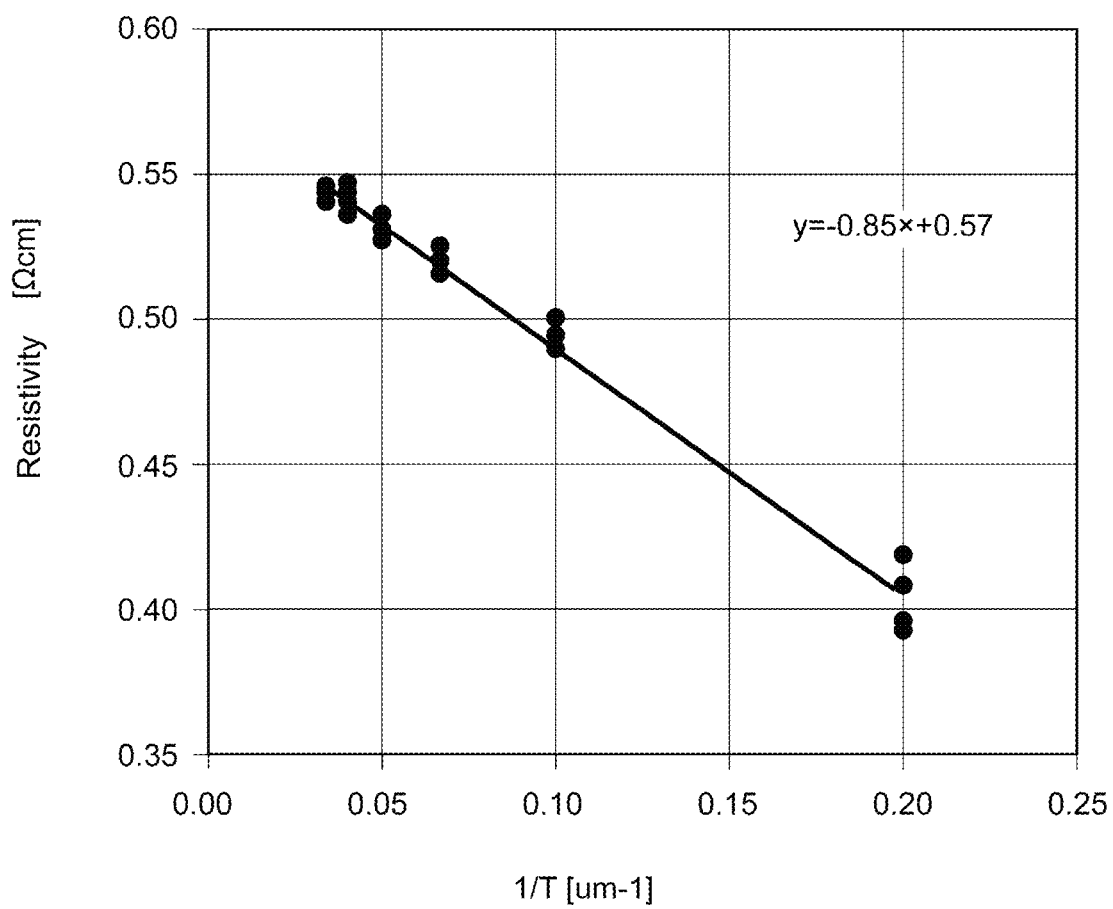
FIG. 10 is a graph showing a relationship between the resistivity of a Si substrate and the thickness of the Si substrate when the quadratic TCF is 0 in the resonator according to the first exemplary embodiment.

FIG. 10 is a graph showing a relationship between the resistivity of the Si substrate F2 and the thickness T of the Si substrate F2 with the quadratic TCF of 0 when the dimension ratio W/T of the vibrator 120 is set to 4 or more in the resonator 10 according to the present embodiment.

In the graph shown in FIG. 10, the horizontal axis indicates the value of the reciprocal number of the thickness T of the Si substrate F2, and the vertical axis indicates the resistivity of the Si substrate F2. The resistivity was measured by using a contactless sheet resistance measuring apparatus that uses an eddy current method.

As shown in FIG. 10, when the reciprocal number of the thickness T of the Si substrate F2 is represented by x and when the resistivity (represented by y) of the Si substrate F2 satisfies Formula 1 presented below, it is possible to set the value of the quadratic TCF to substantially 0.

$$y = -0.85x + 0.57 \pm 0.05 \quad \text{(Formula 1)}$$

The foregoing shows that, when the thickness T of the Si substrate F2, the width W of the vibration region 121, and the resistivity of the Si substrate are set within a range that satisfies Formula 1 presented above in the resonator 10 according to the present embodiment, the quadratic TCF is substantially 0 and it is consequently possible to obtain favorable frequency-temperature characteristics. Moreover, in this case, since the dimension ratio W/T of the vibrator 120 is set to 4 or more, it is possible, as shown in FIG. 7, to approximate the value of the cubic TCF to 0 regardless of the resistivity of the Si substrate F2. Consequently, it is possible to obtain more favorable frequency-temperature characteristics. An example of such a resonator 10 that satisfies Formula 1 is the resonator 10 that has, for example, the following parameters.

Thickness (T) of Si Substrate F2: approximately 30 μm

Thickness of Temperature Characteristic Correction Layer F1: approximately 0.2 μm Thickness of Lower Electrode E1: approximately 0.1 μm Thickness of Upper Electrode E2: approximately 0.2 μm Thickness of Piezoelectric Thin Film F3: approximately 0.8 μm Length (L) of Vibration Region 121: approximately 201 μm Width (W) of Vibration Region 121: approximately 138 μm Long Sides of Vibrator 120: approximately 201 μm Short Sides of Vibrator 120: approximately 138 μm Dimension Ratio W/T of Vibrator 120: approximately 4.6

Figure 11:
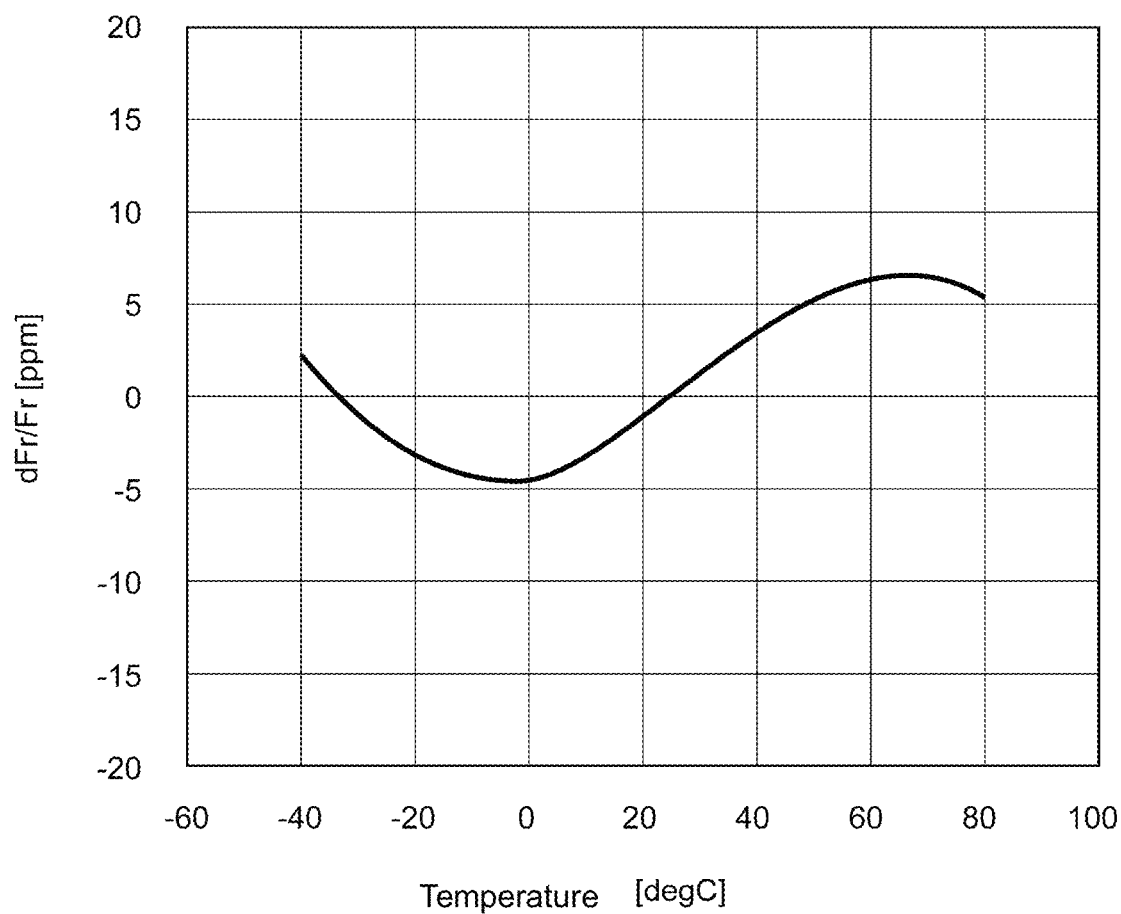
FIG. 11 is a graph showing frequency-temperature characteristics of the resonator according to the first exemplary embodiment.

FIG. 11 is a graph showing results of actual measurement of frequency-temperature characteristics in the resonator 10 that has the aforementioned parameters. In the graph in FIG. 11, the horizontal axis indicates temperature, and the vertical axis indicates the shift amount of frequency. FIG. 11 shows that the resonator 10 according to the present embodiment has favorable frequency-temperature characteristics.

(b) Case in which W/T<4

Figure 12:
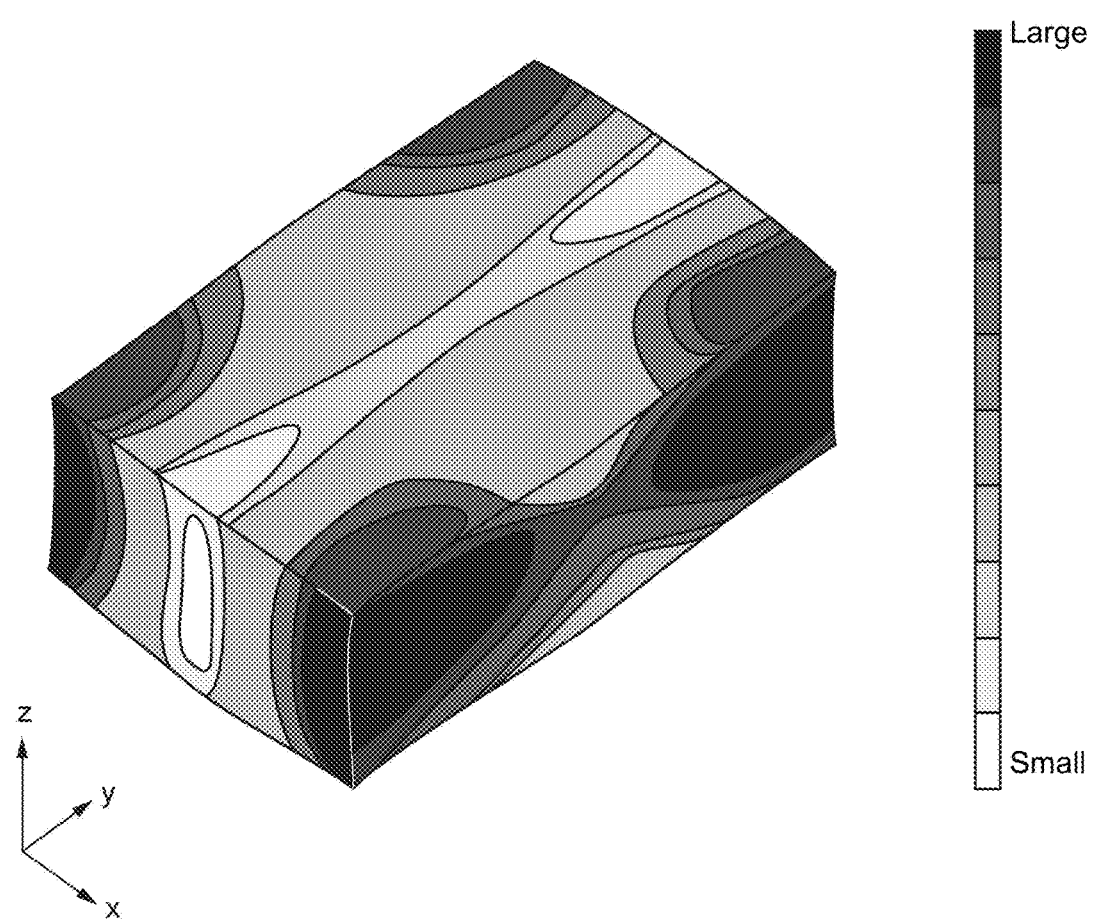
FIG. 12 is a graph showing results of analyzing the vibration mode of the resonator according to the first exemplary embodiment.

FIG. 12 shows results of analysis using FEM regarding a vibration shape when the dimension ratio W/T of the vibrator 120 is set to less than 4 (W: 100, T: 50) in the resonator 10 according to the present embodiment. FIG. 12 selectively shows the analysis results of the vibrator 120 of the resonator 10. In FIG. 12, a light-colored region indicates a region in which a displacement due to vibration is small, and a dark-colored region indicates a region in which a displacement due to vibration is large.

As shown in FIG. 12, in a region in which the dimension ratio W/T of the vibrator 120 is less than 4, as the width W of the vibration region 121 decreases relative to the thickness T of the Si substrate F2, vibration in the width W direction and vibration in the thickness T direction combine with each other and, consequently, the frequency constant decreases and the vibration mode becomes three-dimensional. Therefore, in a region in which the width W of the vibration region 121 is smaller than the thickness T of the Si substrate F2, the influence of the vibration shape applied to the frequency constant and the TCF (linear to cubic) is large. In other words, in this region, the frequency constant and the TCF are subjected to the influences of both the shape of the vibration region 121 and the TCE of the Si substrate F2.

Accordingly, in the region in which W/T<4, it is possible to adjust the quadratic TCF to approximate to 0 by adjusting the resistivity of the Si substrate F2 and the dimension ratio W/T of the vibrator 120.

Figure 13:
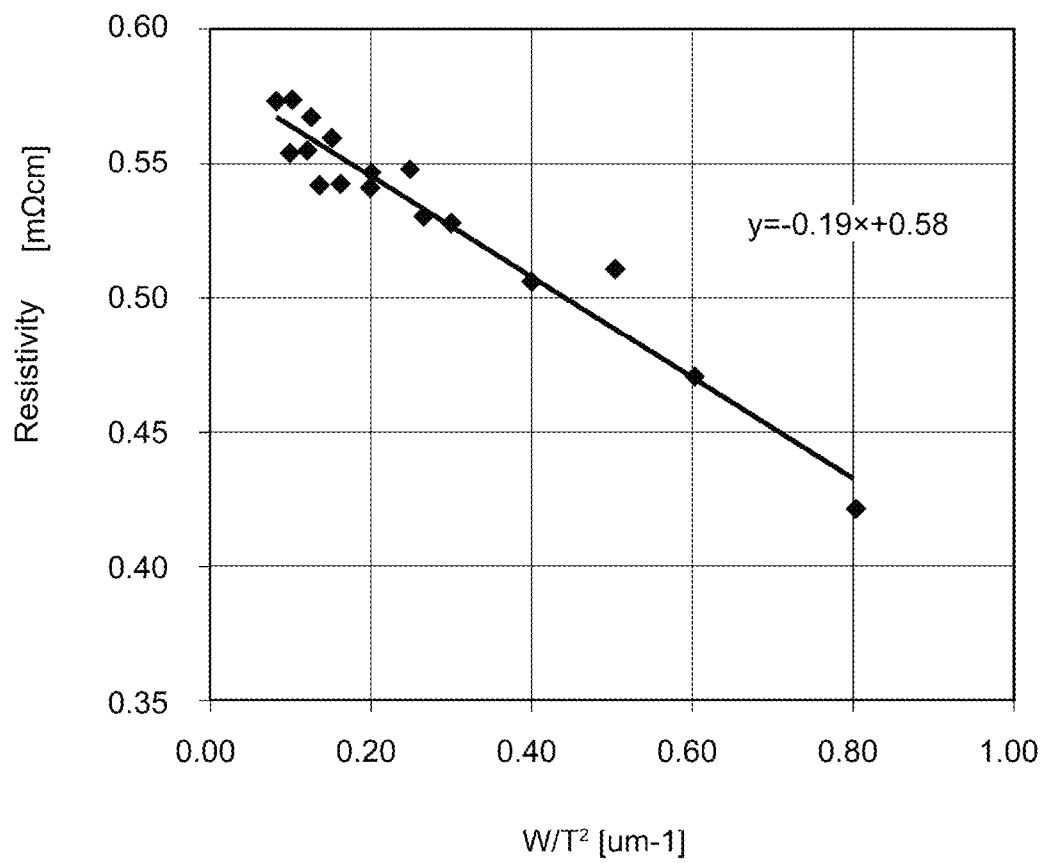
FIG. 13 is a graph showing a relationship among the resistivity of the Si substrate and the thickness and width of the Si substrate when the quadratic TCF is 0 in the resonator according to the first exemplary embodiment.

FIG. 13 is a graph showing a relationship between the resistivity of the Si substrate F2 and the thickness T of the Si substrate F2 with the quadratic TCF of 0 when the dimension ratio W/T of the vibrator 120 is set to less than 4 in the resonator 10 according to the present embodiment.

In the graph shown in FIG. 13, the horizontal axis indicates a value obtained by multiplying the reciprocal number of the thickness T of the Si substrate F2 by 4 or more of the dimension ratio W/T of the vibrator 120, and the vertical axis indicates the resistivity of the Si substrate F2. The resistivity was measured by the same method as that described for FIG. 10.

As shown in FIG. 13, when a value obtained by multiplying the reciprocal number of the thickness T of the Si substrate F2 by the dimension ratio W/T of the vibrator 120 is represented by x and when the resistivity (represented by y) of the Si substrate F2 satisfies Formula 2 presented below, it is possible to set the value of the quadratic TCF to 0.

$$y=-0.19x+0.58\pm0.05 \quad \text{(Formula 2)}$$

The foregoing shows that, when W/T<4 in the resonator 10 according to the present embodiment, if the thickness T of the Si substrate F2, the width W of the vibration region 121, and the resistivity of the Si substrate are set within a range that satisfies Formula 2 presented above, the quadratic TCF is substantially 0 and it is also consequently possible to obtain favorable frequency temperature characteristics. An example of such a resonator 10 that satisfies Formula 2 is the resonator 10 that has, for example, the following parameters.

Thickness (T) of Si Substrate F2: approximately 20 μm
Thickness of Temperature Characteristic Correction Layer F1: approximately 0.2 μm
Thickness of Lower Electrode E1: approximately 0.1 μm
Thickness of Upper Electrode E2: approximately 0.2 μm
Thickness of Piezoelectric Thin Film F3: approximately 0.8 μm
Length (L) of Vibration Region 121: approximately 58 μm
Width (W) of Vibration Region 121: approximately 40 μm
Long Sides of Vibrator 120: approximately 58 μm
Short Sides of Vibrator 120: approximately 40 μm
Dimension Ratio W/T of Vibrator 120: approximately 2

When parameters that satisfy Formula 2 are set in the resonator 10 according to the present embodiment, it is possible to set the resistivity of the Si substrate F2 to a high value and it is thus possible to obtain high mass productivity.

Second Embodiment

In second and subsequent embodiments, description of features shared with the first embodiment will be omitted and only features different therefrom will be described. In particular, the same effects exhibited by the same configurations will not be individually mentioned in each embodiment.

Figure 14:
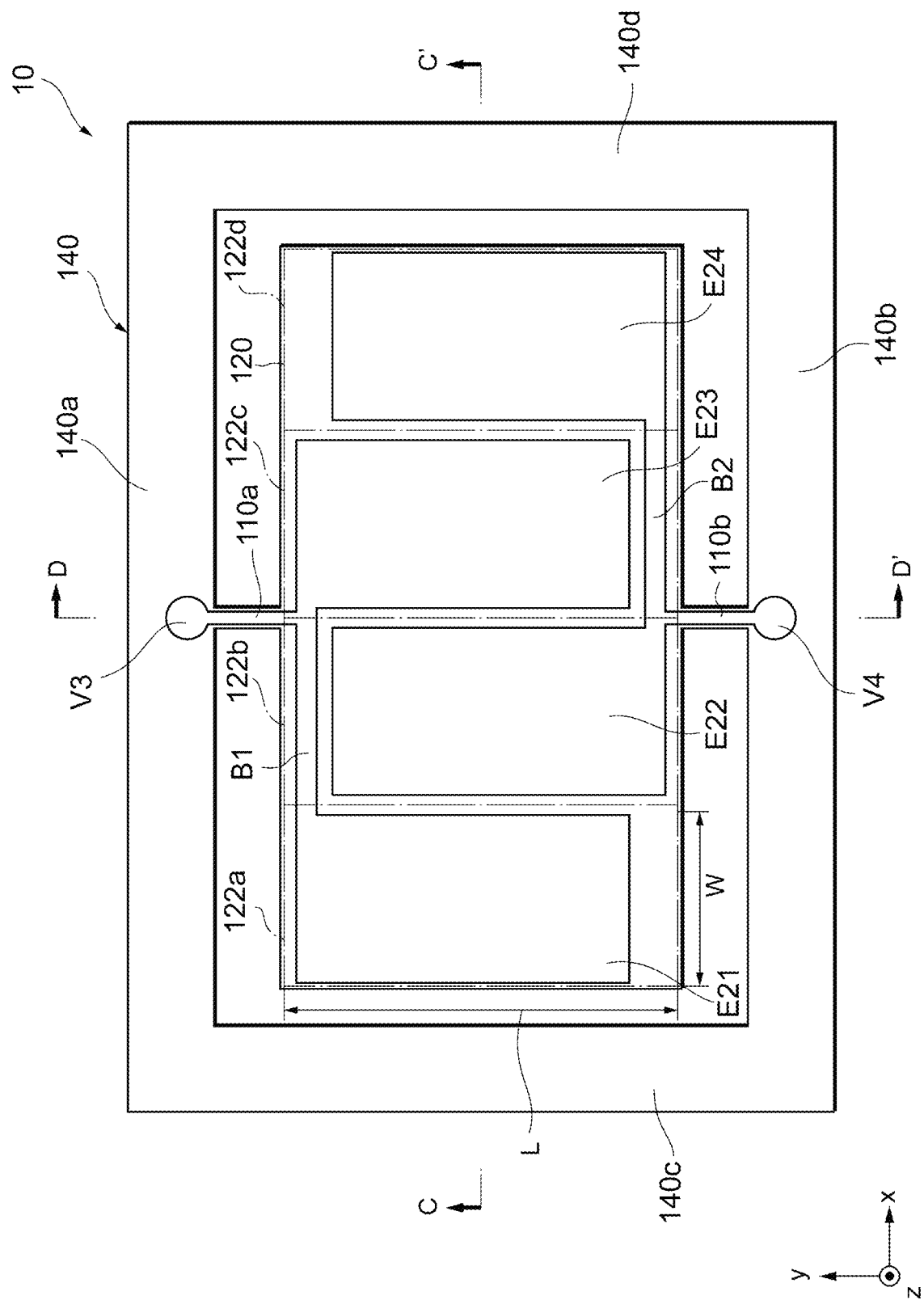
FIG. 14 is a plan view of a resonator according to a second exemplary embodiment.
Figure 15:
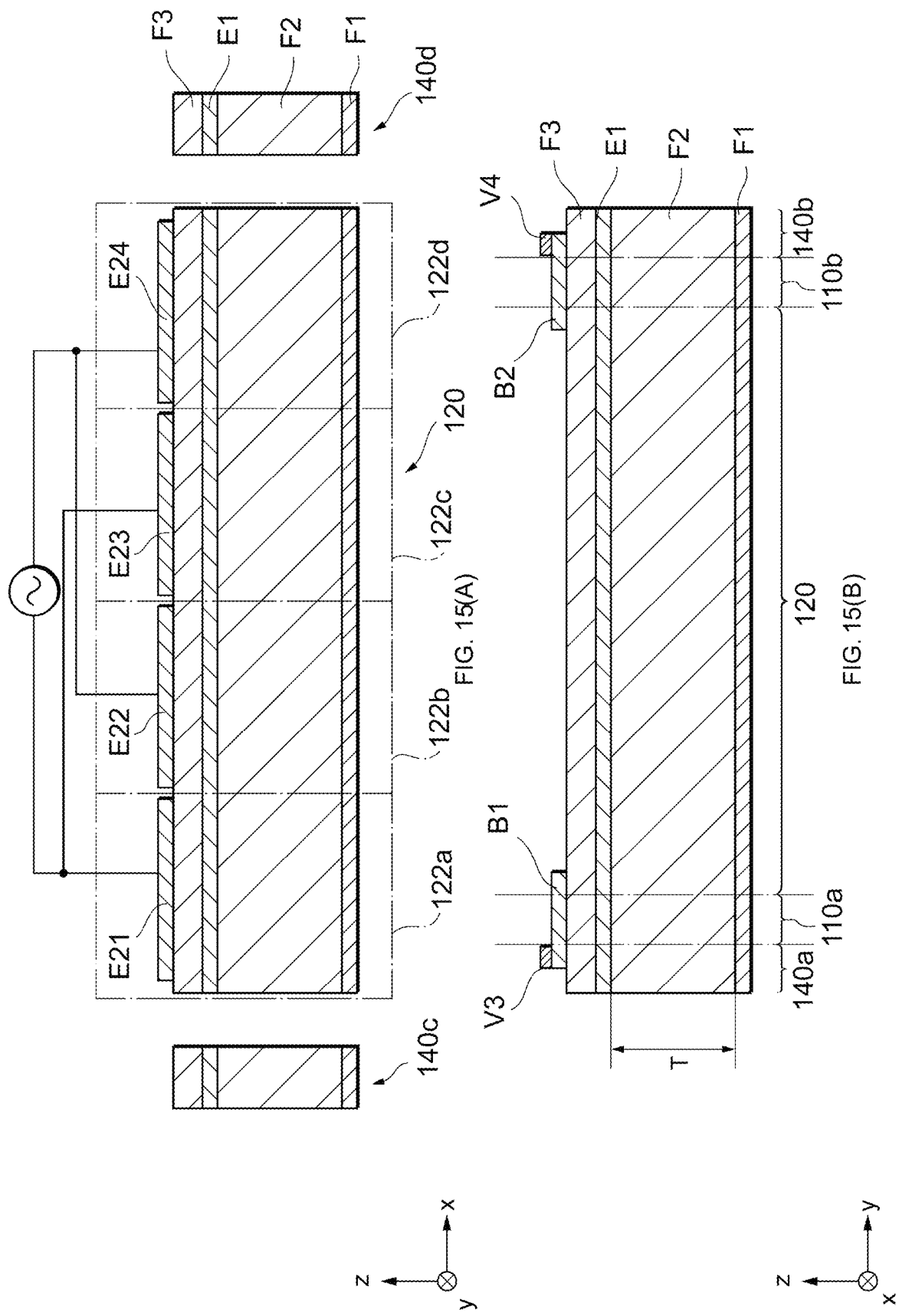
FIGS. 15(A) and 15(B) are sectional views taken along line C-C' and line D-D' in FIG. 14.

With reference to FIGS. 14 and 15, a configuration and a function of the resonator 10 according to the second exemplary embodiment will be described. In the present embodiment, the resonator 10 vibrates in a harmonic (fourth wave) contour vibration mode. Hereinafter, a detailed configuration of the resonance device 1 according to the present embodiment will be described with a focus on differences from the first embodiment.

Vibrator 120

FIG. 14 shows an example of a plan view of the resonator 10 according to the present embodiment.

The vibrator 120 includes four upper electrodes E21 to E24 on the surface thereof. Each of the upper electrodes E21 to E24 has long sides in the Y-axis direction and short sides in the X-axis direction.

Moreover, the upper electrode E21 and the upper electrode E23 are connected to each other via a busbar B1. The upper electrode E22 and the upper electrode E24 are connected to each other via a busbar B2. The busbar B1 is provided on an end portion of the vibrator 120 on the side of the frame body 140a so as to face the upper electrode E22. The busbar B1 is connected to an upper end (end portion on the side of the frame body 140a) of the long side of the upper electrode E21, the long side facing the upper electrode E22, and to an upper end (end portion on the side of the frame body 140a) of the long side of the upper electrode E23, the long side facing the upper electrode E22.

The busbar B2 is provided on an end portion of the vibrator 120 on the side of the frame body 140b so as to face the upper electrode E23. The busbar B2 is connected to a lower end (end portion on the side of the frame body 140b) of the long side of the upper electrode E22, the long side facing the upper electrode E23, and to a lower end (end portion on the side of the frame body 140b) of the long side of the upper electrode E24, the long side facing the upper electrode E23.

While details will be described with reference to FIG. 15, the vibrator 120 has four vibration regions 122a to 122d (hereinafter also collectively referred to as the "vibration regions 122") that produces contour vibration in the X-axis direction with a respective node at a region that connects substantially center portions of the short sides of each of the upper electrodes E21 to E24 shown in FIG. 14 to each other. As shown in FIG. 14, the vibration regions 122a to 122d are provided so as to correspond to the four upper electrodes E21 to E24. Specifically, each of the vibration regions 122a to 122d performs contour vibration in the X-axis direction with the node at a center axis extending in the longitudinal direction of the respective upper electrodes E21 to E24. The vibration regions 122a to 122d are formed with the upper electrodes E21 to E24 positioned at center portions thereof. The vibration regions 122a to 122d divide the vibrator 120 into four.

In the present embodiment, the length L of each of the vibration regions 122 corresponds to the length of the vibrator 120 in a direction along the node of the vibration. The width W of each of the vibration regions 122 corresponds to a size obtained by dividing the length of the vibrator 120 in a direction orthogonal to the node of the vibration by the number (four in the present embodiment) of the upper electrodes E21 to E24. Thus, in the present embodiment, the length L of each of the vibration regions 122 coincides with the length of the short sides of the vibrator 120, and the width W of each of the vibration regions 122 coincides with one-fourth the length of the long sides of the vibrator 120.

In the present embodiment, the length L of the vibration region 121 is approximately 58 μm to 146 μm, and the width W is approximately 40 μm to 100 μm. The length of the long sides of the vibrator 120 is approximately 58 μm to 146 μm, as is the length L, and the length of the short sides is approximately 160 μm to 400 μm, which is four times the width W.

The other configurations of the vibrator 120 are identical to those in the first embodiment and will not be repeated herein.

Holder 140

In the present embodiment, the frame body 140a and the frame body 140b of the holder 140 are connected to the holding arms 110. In addition, in the present embodiment, the holder 140 is provided with terminals V3 and V4 at the frame body 140a and the frame body 140b.

In the present embodiment, the terminal V3 is a terminal for connecting the upper electrodes E21 and E23 to an external portion, and the terminal V4 is a terminal for connecting the upper electrodes E22 and E24 to an external portion. The other configurations of the terminals V3 and V4 are identical to the configurations of the terminals V1 and V2 in the first embodiment. In addition, the other configurations of the holder 140 are identical to those in the first embodiment.

Holding Arms 110

In the present embodiment, the holding arms 110 are provided in a space inside the holder 140 and between the long sides of the vibrator 120 and the frame bodies 140a and 140b and connect the long sides of the vibrator 120 to the respective frame bodies 140a and 140b.

On the surface of the holding arm 110a, the busbar B1 connected to the upper electrodes E21 and E23 extends from the vibrator 120 to the frame body 140a. Meanwhile, on the surface of the holding arm 110b, the busbar B2 connected to the upper electrodes E22 and E24 extends from the vibrator 120 to the frame body 140b.

The other configurations of the holding arms 110 are identical to those in the first embodiment.

Laminate Structure

With reference to FIG. 15, differences of the laminate structure of the resonator 10 from the first embodiment will be described. FIG. 15(A) is a sectional view taken along line C-C' in FIG. 14, and FIG. 15(B) is a sectional view taken along line D-D' in FIG. 14.

In the present embodiment, the resistance value of the degenerate Si used in the Si substrate F2 is, for example, approximately 0.49 mΩ·cm to 0.53 mΩ·cm. The thickness T of the Si substrate F2 is, for example, approximately 10 μm to 20 μm. The thickness of the temperature characteristic correction layer F1 is approximately 0.2 μm to 1.0 μm.

As shown in FIGS. 15(A) and 15(B), in the present embodiment, an element corresponding to the upper electrode E2 in the first embodiment is processed into the upper electrodes E22 to E24 and busbars B1 and B2 by, for example, etching, after being laminated on the piezoelectric thin film F3.

As shown in FIG. 15(A), the vibrator 120 is demarcated into the vibration regions 122a to 122d corresponding to the upper electrodes E21 to E24. In other words, the upper electrodes E21 to E24 are respectively formed in the vibration regions 122a to 122d. When an alternating electric field is applied in the z-axis direction of the piezoelectric thin film F3 to the upper electrodes E21 to E24 so that the phase of each of the upper electrodes E21 to E24 is opposite to that of the electrode adjacent thereto, the adjacent vibration regions 122a to 122d are mechanically joined together. Consequently, a substantially center portion of each region in the X-axis direction becomes the node (node line) of vibration, and the four vibration regions 122a to 122d vibrate in the in-plane direction with respective phase opposite to that of the region adjacent thereto. As a result, the vibrator 120 as a whole produces high-order contour vibration. The Si substrate F2, the lower electrode E1, and the piezoelectric thin film F3 are each shared by the vibration regions 122a to 122d.

In the present embodiment, when the dimension ratio W/T of the vibrator 120 is set to 4 or more, the thickness T of the Si substrate F2, the width W of the vibration region 121, and the resistivity of the Si substrate are set to satisfy Formula 1 presented above. Specifically, in this case, for example, the following parameters are set in the resonator 10 according to the present embodiment.

Thickness (T) of Si Substrate F2: approximately 10 μm
Thickness of Temperature Characteristic Correction Layer F1: approximately 1.0 μm
Thickness of Lower Electrode E1: approximately 0.1 μm
Thickness of Upper Electrode E2: approximately 0.2 μm
Thickness of Piezoelectric Thin Film F3: approximately 0.8 μm
Length (L) of Vibration Region 121: approximately 146 μm
Width (W) of Vibration Region 121: approximately 100 μm
Long Sides of Vibrator 120: approximately 400 μm
Short Sides of Vibrator 120: approximately 146 μm
Dimension Ratio W/T of Vibrator 120: approximately 10

Meanwhile, when the dimension ratio W/T of the vibrator 120 is set to less than 4, the thickness T of the Si substrate F2, the width W of the vibration region 121, and the resistivity of the Si substrate are set to satisfy Formula 2 presented above. Specifically, in this case, for example, the following parameters are set in the resonator 10 according to the present embodiment.

Thickness (T) of Si Substrate F2: approximately 20 μm
Thickness of the temperature characteristic correction layer F1: approximately 0.2 μm
Thickness of Lower Electrode E1: approximately 0.1 μm
Thickness of Upper Electrode E2: approximately 0.2 μm
Thickness of Piezoelectric Thin Film F3: approximately 0.8 μm
Length (L) of Vibration Region 121: approximately 58 μm
Width (W) of Vibration Region 121: approximately 40 μm
Long Sides of Vibrator 120: approximately 160 μm
Short Sides of Vibrator 120: approximately 58 μm
Dimension Ratio W/T of vibrator 120: approximately 2

When parameters that satisfy Formula 2 are set in the resonator 10 according to the present embodiment, it is possible to set the thickness of the Si substrate F2 as thin, and it is thus possible to provide a resonator more suitable for high-frequency use.

The other configurations, functions, and effects of the resonator 10 are identical to those in the first embodiment.

Third Embodiment

Figure 16:
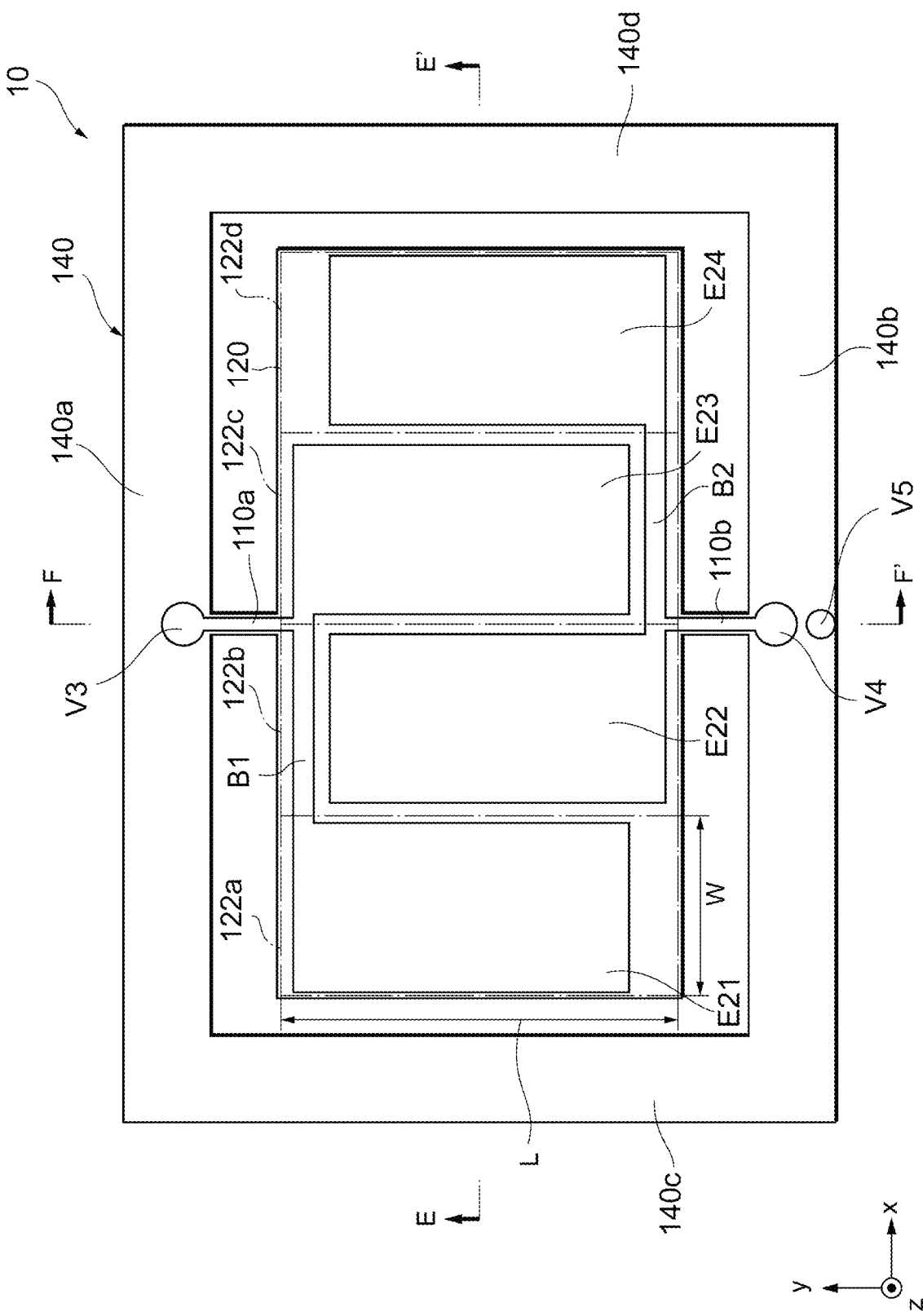
FIG. 16 is a plan view of a resonator according to a third exemplary embodiment.

With reference to FIGS. 16 and 17, a configuration and a function of the resonator 10 according to a third embodiment will be described. In the present embodiment, the resonator 10 vibrates in a harmonic (fourth wave) contour vibration mode. Hereinafter, a detailed configuration of the resonance device 1 according to the present embodiment will be described with a focus on differences from the second embodiment.

In the present embodiment, the holder 140 is provided with a terminal V5 at the frame body 140b in addition to the elements described in the second embodiment. The terminal V5 is a terminal for grounding the lower electrode E1. Other configurations of the terminal V5 are identical to those of the terminal V2 in the first embodiment. In addition, the other configurations of the holder 140 are identical to those in the first embodiment.

Next, with reference to FIG. 17, differences of the laminate structure of the resonator 10 from the second embodiment will be described. FIG. 17(A) is a sectional view taken along line E-E' in FIG. 16, and FIG. 17(B) is a sectional view taken along line F-F' in FIG. 16.

Figures 17A, 17B:
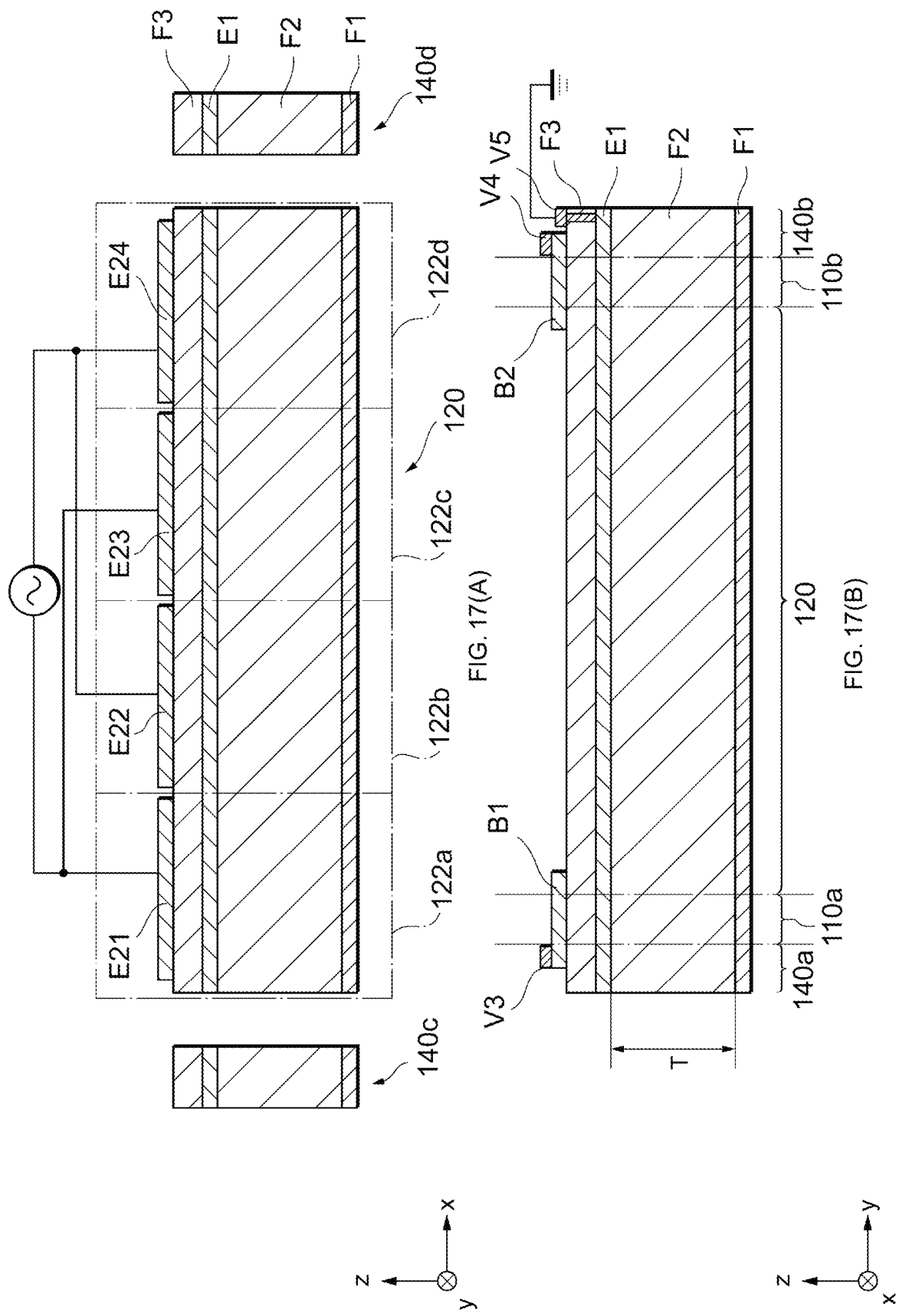
FIGS. 17(A) and 17(B) are sectional views taken along line E-E' and line F-F' in FIG. 16.

As shown in FIG. 17(B), the terminal V5 is connected to the lower electrode E1 through a via formed in the piezoelectric thin film F3. The terminal V5 is grounded via, for example, an electrode formed on an outer surface of the upper cover 30 or the lower cover 20.

Thus, in the resonator 10 according to the present embodiment, the lower electrode E1 is grounded. The grounded lower electrode E1 makes it possible to reduce the influence of other potentials (for example, potentials due to the influence of wires, other components, humans, and the like) present around the lower electrode E1. As a result, it is possible to make the resonance frequency stable.

The other configurations and functions are identical to those in the first embodiment and the second embodiment.

Fourth Embodiment

Figure 18:
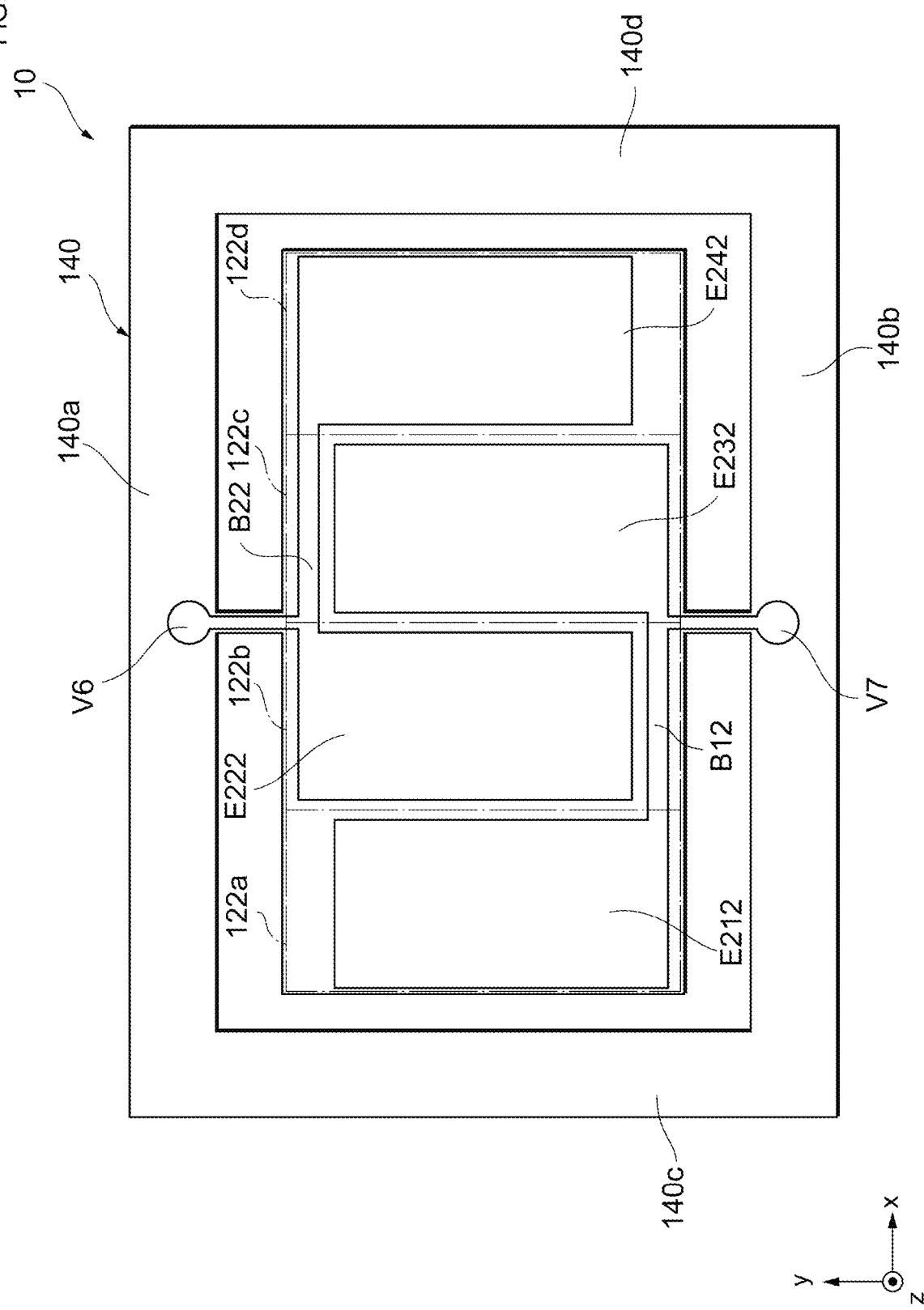
FIG. 18 is a plan view of a second layer of a resonator according to a fourth exemplary embodiment.

With reference to FIGS. 18 and 19, a configuration and a function of the resonator 10 according to a fourth embodiment will be described. Hereinafter, a detailed configuration of the resonance device 1 according to the present embodiment will be described with a focus on differences from the second embodiment.

In the present embodiment, the resonator 10 is provided with two layers of the piezoelectric thin film F3 and a piezoelectric thin film F32 (refer to FIG. 19) and two layers of the upper electrodes E21 to E24 and upper electrodes E212 to E242 (refer to FIG. 19). The number of each of the layers of the piezoelectric thin film and the upper electrodes is not limited to two. The resonator 10 may have a multi-layer structure of two or more layers. In the following description, in the Z-axis direction of the resonator 10, a layer that includes the piezoelectric thin film F3 and the upper electrodes E21 to E24 is referred to as a first layer, a layer that includes the piezoelectric thin film F32 and the upper electrodes E212 to E242 is referred to as a second layer, and a layer that includes the lower electrode E1 is referred to as a lower-electrode layer.

First Layer

The planar structure of the first layer of the resonator 10 according to the fourth embodiment is identical to the planar structure of the resonator 10 according to the second embodiment described in FIG. 14, and description of the planar structure of the first layer thus will be omitted.

Second Layer

FIG. 18 shows an example of the planar view of the second layer of the resonator 10 of the present embodiment. The vibrator 120 according to the present embodiment includes, in the second layer, the upper electrodes E212 to E242 and busbars B12 and B22. As shown in FIG. 18, the vibrator 120 in the second layer has a structure in which the vibrator 120 in the first layer is vertically inverted in the Y-axis direction.

The upper electrodes E212 to E242 are formed at positions corresponding to the upper electrodes E21 to E24 in the first layer.

The upper electrode E212 and the upper electrode E232 are connected at respective lower ends (on the side of the frame body 140b) thereof to the busbar B12. The upper electrode E222 and the upper electrode E242 are connected at respective upper ends (on the side of the frame body 140a) thereof to the busbar B22.

In addition, in the second layer, the holder 140 provided with vias V6 and V7 in the frame body 140a and the frame body 140b, respectively. The via V6 is a via for connecting the upper electrodes E222 and E242 to the first layer, and the via V7 is a via for connecting the upper electrodes E212 and E232 to the first layer.

Sectional Structure

With reference to FIG. 19, a sectional structure of the resonator 10 according to the present embodiment will be described.

FIG. 19(A) is a sectional view of the present embodiment taken along line C-C' in FIG. 14. In the present embodiment, as shown in FIG. 19(A), the piezoelectric thin film F32 is laminated so as to cover the lower electrode E1. In addition, on the piezoelectric thin film F32, the upper electrodes E212 to E242 are laminated. After formed on the vibrator 120, the upper electrodes E212 to E242 are divided into four through processing, for example, etching.

On the upper electrodes E212 to E242, the piezoelectric thin film F3 is laminated, and, in addition, on the piezoelectric thin film F3, the upper electrodes E21 to E24 are formed.

The component and the film thickness of each of the piezoelectric thin film F32 and the upper electrodes E212 to E242 are identical to those, which have been described in the second embodiment, of the piezoelectric thin film F3 and the upper electrodes E21 to E24. The method of manufacturing each of the piezoelectric thin films F3 and F32 and the upper electrodes E21 to E24 and E212 to E242 in the present embodiment is identical to that of each of the piezoelectric thin film F3 and the upper electrodes E21 to E24 in the second embodiment.

FIG. 19(B) is a sectional view of the present embodiment taken along line D-D' in FIG. 14. As shown in FIG. 19(B), the busbar B22 in the second layer extends out to the first layer through the via V6 and is connected to the terminal V3 via the busbar B1. As described above, the busbar B22 is connected (refer to FIG. 18) to the upper electrodes E222 and E242. Consequently, the upper electrodes E222 and E242 are also connected to the terminal V3 through the via V6.

Meanwhile, the busbar B12 in the second layer extends out to the first layer through the via V7 and is connected to the terminal V4 via the busbar B2. As described above, the busbar B12 is connected (refer to FIG. 18) to the upper electrodes E212 and E232. Consequently, the upper electrodes E212 and E232 are also connected to the terminal V4 through the via V7.

As shown in FIG. 19(A), in the resonator 10 in the present embodiment, alternating electric fields of opposite phase are applied to the upper electrodes E21 to E24 and the upper electrodes E212 to E242, which are formed at mutually facing positions in the first layer and the second layer. In other words, an alternating electric field of the same phase is applied to the upper electrodes E21, E23, E222, and E242. In addition, an alternating electric field of a phase opposite to that of the alternating electric field applied to the upper electrodes E21, E23, E222, and E242 is applied to the upper electrodes E22, E24, E212, and E232.

As described above, the resonator 10 according to the present embodiment has the multiple layers of the piezoelectric thin films and the upper electrodes, and it is consequently possible to increase electrostatic capacity and to suppress the influence of stray capacitance.

The other configurations and functions are identical to those in the first embodiment and the second embodiment.

Fifth Embodiment

Figure 20:
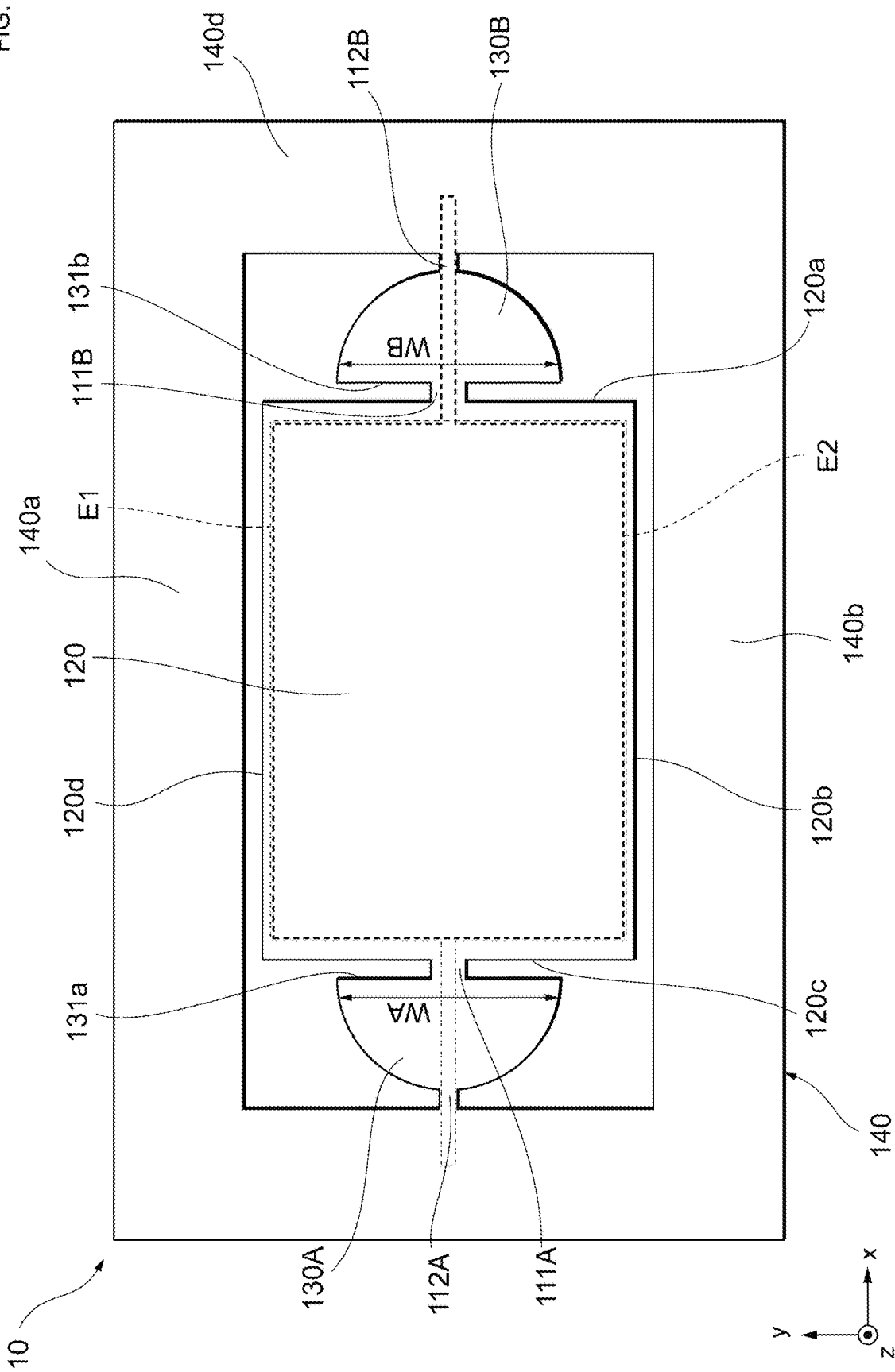
FIG. 20 is a plan view of a resonator according to a fifth exemplary embodiment.

With reference to FIG. 20, a configuration and a function of the resonator 10 according to a fifth embodiment will be described. Hereinafter, a detailed configuration of the resonance device 1 according to the present embodiment will be described with a focus on differences from the first embodiment.

In the present embodiment, the holding arm 110 includes arms 112A and 111A and a node generation portion 130A (also referred to as a "node generator" for purposes of this disclosure).

The node generation portion 130A is provided in a region between the short side (on the side of the frame body 140c) of the vibrator 120 and the frame body 140c of the holder 140. The node generation portion 130A has a side 131a facing the short side of the vibrator 120 and is connected at the side 131a to the arm 111A. The side 131a is substantially parallel to the short side of the vibrator 120 with a constant gap therebetween. The node generation portion 130A is connected to the short side of the vibrator 120 via the arm 111A and connected to the holder 140 via the arm 112A.

The node generation portion 130A has a shape that has a width in the X-axis direction decreasing toward the arm 112A from the arm 111A. In addition, the node generation portion 130A has a shape line-symmetric to the perpendicular bisector of the side 131a. In the node generation portion 130A, a portion that has the maximum width in the X-axis direction is at a position offset from the center in the Y-axis direction toward the arm 111A. In the present embodiment, the width of the node generation portion 130A in the X-axis direction is maximum at the side 131a, gradually decreases toward the arm 112A from the arm 111A, and is minimum at a portion where the apex of the node generation portion 130A and the arm 112A are connected to each other. The width of the node generation portion 130A in the X-axis direction does not necessarily continuously decrease and may decrease, for example, in a stepwise manner or may include an increasing portion, provided that the width gradually decreases overall. The shape of the peripheral edge of the node generation portion 130A is not limited to a smooth shape and may have irregularities.

In the present embodiment, the node generation portion 130A has a semi-circular shape that has a diameter at the side 131a and has a radius of approximately 30 μm. In this case, the center of a circle that forms the arc of the node generation portion 130A is positioned at the center of the side 131a. The center of the circle that forms the arc of the node generation portion 130A may be positioned at the center of the short side of the vibrator 120.

The shape of the side 131a is not limited to a linear shape and may be an arc shape. In this case, the arm 111A is connected to the apex of the side 131a. In addition, in this case, the center of a circle that forms the arc of the side 131a may be positioned on the side of the arm 111A and may be positioned on the side of the arm 112A. The length of the side 131a is preferably larger than the width of the arm 111A in the X-axis direction and smaller than the short side of the vibrator 120.

Next, a configuration of the arms 111A and 112A will be described. In the present embodiment, the arm 111A has a substantially rectangular shape. The arm 111A has one end connected to a substantially center portion of the short side of the vibrator 120, and the arm 111A extends from the substantially center portion substantially perpendicularly to the short side of the vibrator 120 toward the node generation portion 130A. The arm 111A has another end connected to the side 131a of the node generation portion 130A. In the present embodiment, the width of the arm 111A in the X-axis direction is approximately 10 μm.

The arm 112A has a substantially rectangular shape. The arm 112A has one end connected to a portion of the node generation portion 130A having the minimum width in the X-axis direction. The arm 112A has another end connected to the holder 140 in a region facing the node generation portion 130A. The width of the arm 112A in the X-axis direction is preferably smaller than or equal to the width of the arm 111A. It is possible to suppress vibration from being propagated from the node generation portion 130A to the holder 140 by setting the width of the arm 112A so as to be smaller than the width of the arm 111A. In the present embodiment, the width of the arm 112A in the X-axis direction is smaller than the width of the arm 111A, that is, approximately 5 μm.

The node generation portion 130A of the holding arm 110a in the present embodiment has a structure in which a width in the X-axis direction gradually decreases toward the arm 112A from the arm 111A. Thus, even when a propagation state of vibration propagated from the vibrator 120 changes, the node generation portion 130A includes, adjacent to a portion in which displacement due to vibration is large, a portion in which displacement is small. Consequently, it is possible to form a node of vibration on the node generation portion 130A by adjusting a portion of the node generation portion 130A to be displaced due to the vibration that has leaked from the vibrator 120. The node generation portion 130A is enabled to suppress propagation of vibration from the vibrator 120 to the holder 140 by being connected at the formed node to the arm 112A. As a result, it is possible to reduce an anchor loss of the resonator 10 and possible to improve the Q factor.

Meanwhile, in the present embodiment, the holding arm 110b includes arms 111B and 112B and a node generation portion 130B. The configuration and function of the arm 111B is identical to those of the arm 111A, the configuration and function of the arm 112B is identical to those of the arm 112A, and the configuration and function of the node generation portion 130B is identical to those of the node generation portion 130A.

The other configurations and functions of the resonator 10 are identical to those in the first exemplary embodiment described above.

Embodiments as examples of the present invention are described above. The resonator 10 according to the present embodiment includes the vibrator 120 including the Si substrate F2, at least one upper electrode E2 formed so as to have a face facing the surface of the Si substrate F2, and the piezoelectric thin film F3 that is formed between the Si substrate F2 and the upper electrode E2 and that produces contour vibration in a plane along the surface of the Si substrate F2 in accordance with a voltage applied to the upper electrode E2; the holder 140 that surrounds at least a portion of the vibrator 120; and the holding arm 110 that connects the vibrator 120 and the holder 140 to each other. The vibrator 120 includes at least one substantially rectangular vibration region 121 (122) that has the long sides that are parallel to the node of the contour vibration of the piezoelectric thin film F3 and the short sides that are orthogonal to the node of the contour vibration of the piezoelectric thin film F3 and that correspond to the half-wavelength of the contour vibration. The resonator 10 is set within a range that satisfies $W/T \geq 4$ and $y = -0.85 \times (1/T) + 0.57 \pm 0.05$ where T is the thickness of the Si substrate F2 in the direction orthogonal to the surface thereof, W is the width of the short sides of the vibration region 121 (122), and y is the resistivity of the silicon substrate. Consequently, it is possible to approximate the value of the quadratic TCF to 0 and possible to obtain the resonator 10 that has favorable frequency-temperature characteristics. Moreover, in this case, it is also possible to approximate the cubic TCF to 0.

In addition, The resonator 10 according to the present embodiment includes the vibrator 120 including the Si substrate F2, at least one upper electrode E2 that has a face facing the surface of the Si substrate F2, and the piezoelectric thin film F3 that is formed between the Si substrate F2 and the upper electrode E2 and that produces contour vibration in a plane along the surface of the Si substrate F2 in accordance with a voltage applied to the upper electrode E2; the holder 140 that surrounds at least a portion of the vibrator 120; and the holding arm 110 that connects the vibrator 120 and the holder 140 to each other. The vibrator 120 includes at least one substantially rectangular vibration region 121 (122) that has the long sides that are parallel to the node of the contour vibration of the piezoelectric thin film F3 and the short sides that are orthogonal to the node of the contour vibration of the piezoelectric thin film F3 and that correspond to the half-wavelength of the contour vibration. The resonator 10 is set within a range that satisfies W/T<4 and $y=-0.19 \times (W/T^2) + 0.58 \pm 0.05$ where T is the thickness of the Si substrate F2 in the direction orthogonal to the surface thereof, W is the width of the short sides of the vibration region 121 (122), y is the resistivity of the silicon substrate. Consequently, it is possible to approximate the value of the quadratic TCF to 0 and possible to obtain the resonator 10 that has favorable frequency-temperature characteristics.

In addition, the vibrator 120 preferably includes a temperature characteristic correction layer F1 provided on at least the surface of the Si substrate F2 or on a rear surface opposite to the surface. Consequently, it is possible to reduce, at least in the vicinity of a normal temperature, the temperature coefficient (that is, the change rate at each temperature) of the frequency of the vibrator 120.

In addition, the vibrator 120 preferably includes a plurality of multilayer bodies that each include the piezoelectric thin film F3 and the upper electrode E2. Consequently, it is possible to increase the electrostatic capacity and possible to suppress the influence of stray capacitance.

In addition, the holding arms 110 includes the node generation portions 130A and 130B provided between the vibrator 120 and the holder 140; the first arms 111A and 111B that connect the node generation portions 130A and 130B to regions of the vibrator 120 facing the node generation portions 130A and 130B; and the second arms 112A and 112B that connect the node generation portions 130A and 130B to regions of the holder 140 facing the node generation portions 130A and 130B. The node generation portions 130A and 130B each preferably include, at a position offset from a respective center of the node generation portions 130A or 130B in a first direction along the node of the contour vibration toward the first arms 111A or 111B, a portion that has the maximum length in a second direction orthogonal to the first direction, and the node generation portions 130A and 130B each preferably have a shape that has a length in the second direction gradually decreasing toward the second arms 112A or 112B from the portion that has the maximum length. Consequently, it is possible to reduce the anchor loss of the resonator 10 and possible to improve the Q factor.

In addition, the vibrator 120 preferably includes the lower electrode E1 formed between the Si substrate F2 and the piezoelectric thin film F3.

The resonance device 1 according to the present embodiment includes the resonator 10, the lower cover 20 and the upper cover 30 that cover the resonator 10, and the outer electrode, which are described above. Consequently, it is possible to approximate the value of the quadratic TCF to 0 and possible to obtain the resonator 10 that has favorable frequency-temperature characteristics.

In addition, the lower electrode E1 is preferably grounded via the lower cover 20 or the upper cover 30. Consequently, it is possible to reduce the influence of other potentials (for example, potentials due to the influence of wires, other components, humans, and the like) present around the lower electrode E1. As a result, it is possible to make the resonance frequency stable.

A rotation angle formed by the holding arms 110 and the [100] crystal axis or a crystal axis equivalent thereto of the Si substrate F2 formed of the n-type Si semiconductor is preferably larger than 0 degrees and smaller than or equal to 15 degrees (or may be 0 to 15 degrees, inclusive) or within a range from 75 degrees to 90 degrees. In this case, it is possible to further improve the frequency-temperature characteristics of the resonator 10. The rotation angle mentioned above is an angle in a direction in which the holding arms 110 extend relative to a line segment along the [100] crystal axis or the crystal axis equivalent thereto of the Si substrate F2.

The exemplary embodiments described above are for ease of understanding of the present invention and not for limiting the interpretation of the present invention. The present invention can be modified/improved without deviating from the concept thereof and includes equivalents thereof. In other words, the embodiments to which design change is added, as appropriate, by a person skilled in the art are included in the scope of the present invention provided that the features of the present invention are included. For example, the elements included in the embodiments and the arrangements, materials, conditions, shapes, sizes, and the like of the elements are not limited to those presented in the examples and can be changed as appropriate. In addition, the embodiments are presented as examples, and it is needless to say that partial replacement or combination of the configurations indicated in the different embodiments is possible, and these are also included in the scope of the present invention provided that the features of the present invention are included.

REFERENCE SIGNS LIST 1 resonance device
10 resonator
30 upper cover
20 lower cover
140 holder
140a-d frame body
110 holding arm
120 vibrator
F2 Si substrate

The invention claimed is:
1. A resonator comprising:
  a vibrator including:
    a silicon substrate,
    at least one electrode that faces a surface of the silicon substrate, and
    a piezoelectric body disposed between the silicon substrate and the at least one electrode, the piezoelectric body configured to produce contour vibration in a plane along the surface of the silicon substrate based on a voltage applied to the at least one electrode;
  a frame that surrounds at least a portion of the vibrator; and
  at least one holding arm that connects the vibrator to the frame,
  wherein the vibrator includes at least one rectangular vibration region that has a long side parallel to a node of the contour vibration of the piezoelectric body and a short side orthogonal to the node of the contour vibration of the piezoelectric body and corresponding to a half-wavelength of the contour vibration, and wherein W/T≥4 and y=−0.85×(1/T)+0.57±0.05, where T is a thickness of the silicon substrate in a direction orthogonal to the surface thereof, W is a width of the short side of the vibration region, and y is a resistivity of the silicon substrate.

2. The resonator according to claim 1, wherein the vibrator further includes a temperature characteristic correction layer disposed on the surface of the silicon substrate, the temperature characteristic correction layer being configured to reduce a temperature coefficient of a resonance frequency of the vibrator.

3. The resonator according to claim 1, wherein the vibrator further includes a temperature characteristic correction layer disposed on a rear surface of the silicon substrate opposite to the surface, the temperature characteristic correction layer being configured to reduce a temperature coefficient of a resonance frequency of the vibrator.

4. The resonator according to claim 1, wherein the vibrator further includes a plurality of multilayer bodies that each include the piezoelectric body and the at least one electrode.

5. The resonator according to claim 1, wherein the at least one holding arm includes:
a node generator disposed between the vibrator and the frame,
a first arm that connects the node generator to a region of the vibrator facing the node generator, and
a second arm that connects the node generator to a region of the frame facing the node generator.

6. The resonator according to claim 1,
wherein the node generator includes, at a position offset from a center of the node generator in a first direction along the node of the contour vibration toward the first arm, a portion that has a maximum length in a second direction orthogonal to the first direction, and
wherein the node generator has a shape with has a length in the second direction gradually decreasing toward the second arm from the portion that has the maximum length.

7. The resonator according to claim 6, wherein the node generator comprises a semi-circular shape with a straight edge adjacent to and extending parallel to the respective short side of the vibrator.

8. The resonator according to claim 1, wherein the vibrator further includes a lower electrode disposed between the silicon substrate and the piezoelectric body.

9. A resonance device comprising:
the resonator according to claim 1;
a covering body that covers the resonator; and
an outer electrode.

10. The resonance device according to claim 9,
wherein the vibrator further includes a lower electrode disposed between the silicon substrate and the piezoelectric body, and
wherein the lower electrode is grounded via the covering body.

11. A resonator comprising:
a vibrator including:
a silicon substrate,
at least one electrode that faces a surface of the silicon substrate, and
a piezoelectric body disposed between the silicon substrate and the at least one electrode, the piezoelectric body configured to produce contour vibration in a plane along the surface of the silicon substrate based on a voltage applied to the at least one electrode;
a frame that surrounds at least a portion of the vibrator; and
at least one holding arm that connects the vibrator to the frame,
wherein the vibrator includes at least one rectangular vibration region that has a long side parallel to a node of the contour vibration of the piezoelectric body and a short side orthogonal to the node of the contour vibration of the piezoelectric body and corresponding to a half-wavelength of the contour vibration, and
wherein W/T<4 and y=−0.19×(W/T$^2$)+0.58±0.05, where T is a thickness of the silicon substrate in a direction orthogonal to the surface thereof, W is a width of the short side of the vibration region, and y is a resistivity of the silicon substrate.

12. The resonator according to claim 11, wherein the vibrator further includes a temperature characteristic correction layer disposed on the surface of the silicon substrate, the temperature characteristic correction layer being configured to reduce a temperature coefficient of a resonance frequency of the vibrator.

13. The resonator according to claim 11, wherein the vibrator further includes a temperature characteristic correction layer disposed on a rear surface of the silicon substrate opposite to the surface, the temperature characteristic correction layer being configured to reduce a temperature coefficient of a resonance frequency of the vibrator.

14. The resonator according to claim 11, wherein the vibrator further includes a plurality of multilayer bodies that each include the piezoelectric body and the at least one electrode.

15. The resonator according to claim 11, wherein the at least one holding arm includes:
a node generator disposed between the vibrator and the frame,
a first arm that connects the node generator to a region of the vibrator facing the node generator, and
a second arm that connects the node generator to a region of the frame facing the node generator.

16. The resonator according to claim 11,
wherein the node generator includes, at a position offset from a center of the node generator in a first direction along the node of the contour vibration toward the first arm, a portion that has a maximum length in a second direction orthogonal to the first direction, and
wherein the node generator has a shape with has a length in the second direction gradually decreasing toward the second arm from the portion that has the maximum length.

17. The resonator according to claim 16, wherein the node generator comprises a semi-circular shape with a straight edge adjacent to and extending parallel to the respective short side of the vibrator.

18. The resonator according to claim 11, wherein the vibrator further includes a lower electrode disposed between the silicon substrate and the piezoelectric body.

19. A resonance device comprising:
the resonator according to claim 11;
a covering body that covers the resonator; and
an outer electrode.

20. The resonance device according to claim 19,
wherein the vibrator further includes a lower electrode disposed between the silicon substrate and the piezoelectric body, and
wherein the lower electrode is grounded via the covering body.

* * * * *